US012476654B2

(12) United States Patent
Tan et al.

(10) Patent No.: US 12,476,654 B2
(45) Date of Patent: Nov. 18, 2025

(54) DECODER, DECODING METHOD, MEMORY CONTROLLER, AND MEMORY SYSTEM

(71) Applicant: YANGTZE MEMORY TECHNOLOGIES CO., LTD., Wuhan (CN)

(72) Inventors: Hua Tan, Wuhan (CN); Huiping Sun, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 27 days.

(21) Appl. No.: 18/370,660

(22) Filed: Sep. 20, 2023

(65) Prior Publication Data
US 2024/0429941 A1 Dec. 26, 2024

Related U.S. Application Data

(63) Continuation of application No. PCT/CN2023/102151, filed on Jun. 25, 2023.

(51) Int. Cl.
*H03M 13/11* (2006.01)

(52) U.S. Cl.
CPC ...... *H03M 13/1125* (2013.01); *H03M 13/116* (2013.01)

(58) Field of Classification Search
CPC ........... H03M 13/1125; H03M 13/116; H03M 13/1137; H03M 13/114; G06F 11/1048
See application file for complete search history.

(56) References Cited

U.S. PATENT DOCUMENTS 8,291,285 B1   10/2012   Varnica et al.
8,464,142 B2 *  6/2013   Gunnam ............ H03M 13/1142
                                                              714/781

(Continued)

FOREIGN PATENT DOCUMENTS

CN    102281125 A    12/2011
CN    108370253 A     8/2018
(Continued)

OTHER PUBLICATIONS

Extended European Search Report issued in corresponding European Application No. EP23924479, dated Apr. 11, 2025, 16 pages.
(Continued)

*Primary Examiner* — Steve N Nguyen
(74) *Attorney, Agent, or Firm* — BAYES PLLC

(57) ABSTRACT

According to one aspect, the present disclosure provides a decoder. The decoder may include a posterior probability storage module that stores a posterior probability message respectively corresponding to each of a plurality of cyclic permutation matrices. The decoder may include a node message storage module that stores a message transmitted to a variable node by a check node respectively corresponding to each of the plurality of cyclic permutation matrices. The decoder may include a message updating module that sequentially receives the posterior probability message and the message transmitted to the variable node by the check node respectively corresponding to each of the plurality of cyclic permutation matrices in a first order, and sequentially outputs the updated message transmitted to the variable node by the check node and an updated posterior probability message respectively corresponding to each of the plurality of cyclic permutation matrices in a second order.

20 Claims, 8 Drawing Sheets

(56) References Cited

U.S. PATENT DOCUMENTS

| | | | |
|---|---|---|---|
| 10,673,461 B2* | 6/2020 | Chen | H03M 13/1122 |
| 2008/0320374 A1* | 12/2008 | Prabhakar | H03M 13/6516 |
| | | | 714/801 |
| 2010/0153819 A1 | 6/2010 | Ueng et al. | |
| 2010/0192036 A1* | 7/2010 | Sandberg | H03M 13/1137 |
| | | | 714/752 |
| 2011/0264979 A1 | 10/2011 | Gunnam et al. | |
| 2017/0264314 A1* | 9/2017 | Huang | H03M 13/616 |
| 2018/0343082 A1 | 11/2018 | Xiong et al. | |
| 2019/0324849 A1* | 10/2019 | Kim | H03M 13/1131 |
| 2020/0014408 A1 | 1/2020 | Kim | |
| 2020/0336156 A1* | 10/2020 | Kim | H03M 13/114 |
| 2022/0190845 A1* | 6/2022 | Asadi | H03M 13/1108 |

FOREIGN PATENT DOCUMENTS

| | | |
|---|---|---|
| CN | 108696282 A | 10/2018 |
| CN | 110391816 A | 10/2019 |
| CN | 112242851 A | 1/2021 |
| CN | 115714603 A | 2/2023 |
| DE | 102019127089 A1 | 4/2020 |

OTHER PUBLICATIONS

Sun Yang et al: "VLSI Architecture for Layered Decoding of QC-LDPC Codes With High Circulant Weight", IEEE Transactions on Very Large Scale Integration (VLSI) Systems, IEEE Service Center, Piscataway, NJ, USA, vol. 21, No. 10, Oct. 1, 2013 (Oct. 1, 2013), pp. 1960-1964.

Zhang Yishan et al: "A high-throughput multi-rate LDPC decoder for error correction of solid-state drives", 2015 IEEE Workshop on Signal Processing Systems {SIPS), IEEE, Oct. 14, 2015 (Oct. 14, 2015), pp. 1-6.

Kim Jonghong et al: "Rate-0.96 LDPC Decoding VLSI for Soft-Decision Error Correction of NAND Flash Memory", IEEE Transactions on Very Large Scale Integration (VLSI) Systems, IEEE Service Center, Piscataway, NJ, USA, vol. 22, No. 5, May 1, 2014 (May 1, 2014), pp. 1004-1015.

* cited by examiner

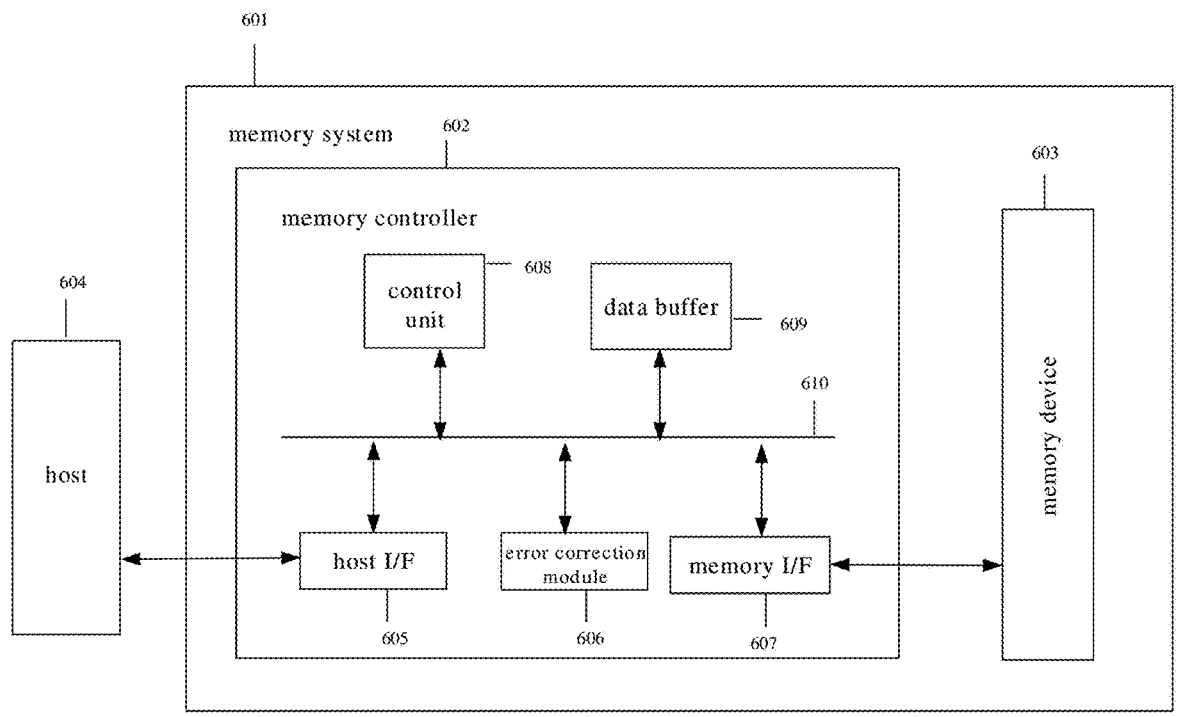

Fig. 9 storing the posterior probability message respectively corresponding to each of the cyclic permutation matrices using a posterior probability storage module

↓ storing the message transmitted to a variable node by a check node respectively corresponding to each of the cyclic permutation matrices using a node message storage module

↓ using a message updating module, sequentially receiving the posterior probability message and the message transmitted to the variable node by the check node respectively corresponding to each of the cyclic permutation matrices in a first order, and sequentially outputting the updated message transmitted to the variable node by the check node and updated posterior probability message respectively corresponding to each of the cyclic permutation matrices in the second order; wherein the first order is the same as or different from the second order

Fig. 10

DECODER, DECODING METHOD, MEMORY CONTROLLER, AND MEMORY SYSTEM

CROSS-REFERENCE TO RELATED APPLICATIONS

This application is a continuation of International Application No. PCT/CN2023/102151, filed on Jun. 25, 2023, which is incorporated herein by reference in its entirety.

TECHNICAL FIELD

The present disclosure relates to, but is not limited to, a decoder, a decoding method, a memory controller, a memory system and an electronic device.

BACKGROUND

With the rapid development of data storage technology, more and more data memory systems appear in electronic devices, e.g., such as solid state drives (SSD). SSD has been widely used in military, vehicle, industrial, medical, and aviation fields because of its fast reading and writing speeds, anti-vibration, low-power consumption, limited or no noise output, low-heat dissipation, and light weight.

SUMMARY

According to one aspect of the present disclosure, a decoder is provided. The decoder may include a posterior probability storage module configured to store a posterior probability message respectively corresponding to each of a plurality of cyclic permutation matrices. The decoder may include a node message storage module configured to store a message transmitted to a variable node by a check node respectively corresponding to each of the plurality of cyclic permutation matrices. The decoder may include a message updating module. The message updating module may be configured to sequentially receive the posterior probability message and the message transmitted to the variable node by the check node respectively corresponding to each of the plurality of cyclic permutation matrices in a first order. The message updating module may be configured to sequentially output the updated message transmitted to the variable node by the check node and an updated posterior probability message respectively corresponding to each of the plurality of cyclic permutation matrices in a second order. The first order may be the same as or different from the second order.

In some implementations, the message updating module may include a first storage unit. In some implementations, the first storage unit may be configured to store symbol values of the message transmitted to the check node by the variable node corresponding to a plurality of the plurality of cyclic permutation matrices. In some implementations, the first storage unit may be provided with a first read address and a first write address. In some implementations, the first storage unit may be caused to sequentially input the symbol values of the message transmitted to the check node by the variable node respectively corresponding to each of the plurality of cyclic permutation matrices in the first order through the first write address. In some implementations, the first storage unit may be caused to sequentially output the symbol values of the message transmitted to the check node by the variable node respectively corresponding to each of the plurality of cyclic permutation matrices in the second order through the first read address. In some implementations, the message updating module may include a second storage unit configured to store a latest negative message transmitted to the variable node by the check node corresponding to the plurality of cyclic permutation matrices stored in the node message storage module. In some implementations, the second storage unit may be provided with a second read address and a second write address. In some implementations, the second storage unit may be caused to sequentially input the latest negative message transmitted to the variable node by the check node respectively corresponding to each of the plurality of cyclic permutation matrices stored in the node message storage module in the first order through the second write address. In some implementations, the second storage unit may be caused to sequentially output latest negative message transmitted to the variable node by the check node respectively corresponding to each of the plurality of cyclic permutation matrices stored in the node message storage module in the second order through the second read address.

In some implementations, the first storage unit and the second storage unit respectively include a random access memory.

In some implementations, a depth of the first storage unit may be a total weight of a quasi-cyclic low-density parity check code base matrix. In some implementations, a width of the first storage unit is a product of a size of a cyclic permutation matrix and the width of the message of a check node transmitted to the variable node by the check node. In some implementations, a depth of the second storage unit is the total weight of the quasi-cyclic low-density parity check code base matrix. In some implementations, a width of the second storage unit is the size of a cyclic permutation matrix.

In some implementations, the message updating module may further include a first calculation unit configured to calculate a minimum value, a sub-minimum value, and a symbol XOR value corresponding to a layer of a check matrix. In some implementations, a message updating unit transmitted to the variable node by the check node and configured to sequentially receive the symbol values of the message transmitted to the check node by the variable node respectively corresponding to each of the plurality of cyclic permutation matrices stored in the first storage unit in the second order. In some implementations, a message updating unit transmitted to the variable node by the check node and configured to receive the minimum value, the sub-minimum value and the symbol XOR value corresponding to a layer of the check matrix calculated by the first calculation unit. In some implementations, a message updating unit transmitted to the variable node by the check node and configured to sequentially output the updated message transmitted to the variable node by the check node respectively corresponding to each of the plurality of cyclic permutation matrices in the second order.

In some implementations, the message updating module may further include an inverse permutation unit configured to arrange a sequence of the updated message transmitted to the variable node by the check node respectively corresponding to each of the plurality of cyclic permutation matrices, which are output in the second order by the message updating unit transmitted to the variable node by the check node, according to an order of a corresponding variable node permuted from the order of the check node.

In some implementations, the message updating module may further include a second calculation unit configured to sequentially output the updated posterior probability message respectively corresponding to each of the plurality of cyclic permutation matrices in the second order based on the message corresponding to each of the plurality of cyclic permutation matrices obtained from a permutation by the inverse permutation unit. In some implementations, the message may correspond to each of the plurality of cyclic permutation matrices stored in the second storage unit. In some implementations, the message may correspond to each of the plurality of cyclic permutation matrices stored in the posterior probability storage module.

In some implementations, the posterior probability storage module may include two real dual-port random access memories.

In some implementations, the message updating module may further include a third calculation unit. In some implementations, the third calculation unit may be configured to sequentially receive a latest posterior probability message respectively corresponding to each of the plurality of cyclic permutation matrices stored in the posterior probability storage module in the first order. In some implementations, the third calculation unit may be configured to sequentially receive the latest negative message transmitted to the variable node by the check node respectively corresponding to each of the plurality of cyclic permutation matrices stored in the node message storage module in the first order. In some implementations, the third calculation unit may be configured to sequentially output the message transmitted to the check node by the variable node respectively corresponding to each of the plurality of cyclic permutation matrices in the first order.

In some implementations, the message updating module may further include a permutation unit. In some implementations, the permutation unit may be configured to sequentially arrange a sequence of message transmitted to the check node by the variable node corresponding to each of the plurality of cyclic permutation matrices output by the third calculation unit, according to an order of the corresponding check node permuted from the order of the variable node.

According to another aspect of the present disclosure, a memory controller is provided. The memory controller may include a decoder. The decoder may include a posterior probability storage module configured to store a posterior probability message respectively corresponding to each of a plurality of cyclic permutation matrices. The decoder may include a node message storage module configured to store a message transmitted to a variable node by a check node respectively corresponding to each of the plurality of cyclic permutation matrices. The decoder may include a message updating module. The message updating module may be configured to sequentially receive the posterior probability message and the message transmitted to the variable node by the check node respectively corresponding to each of the plurality of cyclic permutation matrices in a first order. The message updating module may be configured to sequentially output the updated message transmitted to the variable node by the check node and an updated posterior probability message respectively corresponding to each of the plurality of cyclic permutation matrices in a second order. The first order may be the same as or different from the second order.

In some implementations, the message updating module may include a first storage unit. In some implementations, the first storage unit may be configured to store symbol values of the message transmitted to the check node by the variable node corresponding to a plurality of the plurality of cyclic permutation matrices. In some implementations, the first storage unit may be provided with a first read address and a first write address. In some implementations, the first storage unit may be caused to sequentially input the symbol values of the message transmitted to the check node by the variable node respectively corresponding to each of the plurality of cyclic permutation matrices in the first order through the first write address. In some implementations, the first storage unit may be caused to sequentially output the symbol values of the message transmitted to the check node by the variable node respectively corresponding to each of the plurality of cyclic permutation matrices in the second order through the first read address. In some implementations, the message updating module may include a second storage unit configured to store a latest negative message transmitted to the variable node by the check node corresponding to the plurality of cyclic permutation matrices stored in the node message storage module. In some implementations, the second storage unit may be provided with a second read address and a second write address. In some implementations, the second storage unit may be caused to sequentially input the latest negative message transmitted to the variable node by the check node respectively corresponding to each of the plurality of cyclic permutation matrices stored in the node message storage module in the first order through the second write address. In some implementations, the second storage unit may be caused to sequentially output latest negative message transmitted to the variable node by the check node respectively corresponding to each of the plurality of cyclic permutation matrices stored in the node message storage module in the second order through the second read address.

According to a further aspect of the present disclosure, a method of decoding is provided. The method may include storing a posterior probability message respectively corresponding to each of a plurality of cyclic permutation matrices using a posterior probability storage module. The method may include storing the message transmitted to a variable node by a check node respectively corresponding to each of the plurality of cyclic permutation matrices using a node message storage module. The method may include sequentially receiving, using a message updating module, the posterior probability message and the message transmitted to the variable node by the check node respectively corresponding to each of the plurality of cyclic permutation matrices in a first order. The method may include sequentially outputting, using a message updating module, the updated message transmitted to the variable node by the check node and an updated posterior probability message respectively corresponding to each of the plurality of cyclic permutation matrices in a second order. The first order may be the same as or different from the second order.

In some implementations, the sequentially outputting, using the message updating module, the updated message transmitted to the variable node by the check node and the updated posterior probability message respectively corresponding to each of the plurality of cyclic permutation matrices in the second order may include storing, using a first storage unit, symbol values of the message transmitted to the check node by the variable node corresponding to a plurality of the plurality of cyclic permutation matrices. In some implementations, the first storage unit may be provided with a first read address and a first write address. In some implementations, the first storage unit may be caused to sequentially input the symbol values of the message transmitted to the check node by the variable node respectively corresponding to each of the plurality of cyclic permutation matrices in the first order through the first write address. In some implementations, the first storage unit may be caused to sequentially output the symbol values of the message transmitted to the check node by the variable node respectively corresponding to each of the plurality of cyclic permutation matrices in the second order through the first read address. In some implementations, the sequentially outputting, using the message updating module, the updated message transmitted to the variable node by the check node and the updated posterior probability message respectively corresponding to each of the plurality of cyclic permutation matrices in the second order may include storing, using a second storage unit, the latest negative message transmitted to the variable node by the check node corresponding to the plurality of cyclic permutation matrices stored in the node message storage module. In some implementations, the second storage unit may be provided with a second read address and a second write address. In some implementations, the second storage unit may be caused to sequentially input the latest negative message transmitted to the variable node by the check node respectively corresponding to each of the plurality of cyclic permutation matrices stored in the node message storage module in the first order through the second write address. In some implementations, the second storage unit may be caused to sequentially output latest negative message transmitted to the variable node by the check node respectively corresponding to each of the plurality of cyclic permutation matrices stored in the node message storage module in the second order through the second read address.

In some implementations, the sequentially outputting, using the message updating module, the updated message transmitted to the variable node by the check node respectively corresponding to each of the plurality of cyclic permutation matrices in the second order may include calculating, using a first calculation unit, a minimum value, a sub-minimum value and a symbol XOR value corresponding to a layer of a check matrix. In some implementations, the sequentially outputting, using the message updating module, the updated message transmitted to the variable node by the check node respectively corresponding to each of the plurality of cyclic permutation matrices in the second order may include sequentially receiving, using a message updating unit transmitted to the variable node by the check node, the symbol values of the message transmitted to the check node by the variable node respectively corresponding to each of the plurality of cyclic permutation matrices stored in the first storage unit in the second order. In some implementations, the sequentially outputting, using the message updating module, the updated message transmitted to the variable node by the check node respectively corresponding to each of the plurality of cyclic permutation matrices in the second order may include receiving, using the message updating unit transmitted to the variable node by the check node, the minimum value, the sub-minimum value and the symbol XOR value corresponding to a layer of the check matrix calculated by the first calculation unit. In some implementations, the sequentially outputting, using the message updating module, the updated message transmitted to the variable node by the check node respectively corresponding to each of the plurality of cyclic permutation matrices in the second order may include sequentially outputting, using the message updating unit transmitted to the variable node by the check node, the updated message transmitted to the variable node by the check node respectively corresponding to each of the plurality of cyclic permutation matrices in the second order.

In some implementations, the sequentially outputting, using the message updating module, updated message transmitted to the variable node by the check node and the updated posterior probability message respectively corresponding to each of the plurality of cyclic permutation matrices in the second order may include arranging, using an inverse permutation unit, a sequence of updated message transmitted to the variable node by the check node respectively corresponding to each of the plurality of cyclic permutation matrices, which are output in the second order by the message updating unit transmitted to the variable node by the check node, according to an order of a corresponding variable node permuted from the order of the check node.

In some implementations, the sequentially outputting, using the message updating module, the updated posterior probability message respectively corresponding to each of the plurality of cyclic permutation matrices in the second order may include sequentially outputting, using a second calculation unit, the updated posterior probability message respectively corresponding to each of the plurality of cyclic permutation matrices in the second order based on the message corresponding to each of the plurality of cyclic permutation matrices obtained from a permutation by the inverse permutation unit, the message corresponding to each of the plurality of cyclic permutation matrices stored in the second storage unit, and the message corresponding to each of the plurality of cyclic permutation matrices stored in the posterior probability storage module.

In some implementations, the sequentially outputting, using the message updating module, the updated message transmitted to the variable node by the check node and the updated posterior probability message respectively corresponding to each of the plurality of cyclic permutation matrices in the second order may include sequentially receiving, using a third calculation unit, a latest posterior probability message respectively corresponding to each of the plurality of cyclic permutation matrices stored in the posterior probability storage module in the first order. In some implementations, the sequentially outputting, using the message updating module, the updated message transmitted to the variable node by the check node and the updated posterior probability message respectively corresponding to each of the plurality of cyclic permutation matrices in the second order may include sequentially receiving, using the third calculation unit, a latest negative message transmitted to the variable node by the check node respectively corresponding to each of the plurality of cyclic permutation matrices stored in the node message storage module in the first order. In some implementations, the sequentially outputting, using the message updating module, the updated message transmitted to the variable node by the check node and the updated posterior probability message respectively corresponding to each of the plurality of cyclic permutation matrices in the second order may include sequentially outputting, using the third calculation unit, the message transmitted to the check node by the variable node respectively corresponding to each of the plurality of cyclic permutation matrices in the first order.

In some implementations, the sequentially outputting, using the message updating module, the updated message transmitted to the variable node by the check node and the updated posterior probability message respectively corresponding to each of the plurality of cyclic permutation matrices in the second order may include sequentially arranging, using a permutation unit, a sequence of message transmitted to the check node by the variable node corresponding to each of the plurality of cyclic permutation matrices output by the third calculation unit, according to an order of the corresponding check node permuted from the order of the variable node.

In some implementations, the method may include receiving the updated posterior probability message respectively corresponding to each of the plurality of cyclic permutation matrices. In some implementations, the method may include substituting the received updated posterior probability message respectively corresponding to each of the plurality of cyclic permutation matrices into check equations to make a check. In some implementations, the method may include if all the check equations are satisfied, determining that the decoding is successful. In some implementations, the method may include if not all the check equations are satisfied, determining that the decoding fails, and a next iteration is needed to update the posterior probability message and the message transmitted to the variable node by the check node until the decoding is successful or a maximum iteration is reached.

BRIEF DESCRIPTION OF THE DRAWINGS

FIG. 9 is a schematic diagram of a memory system, according to an implementation of the present disclosure.

FIG. 10 is a schematic diagram of the implementation flow of a decoding method, according to an implementation of the present disclosure.

DETAILED DESCRIPTION

Figure 1:
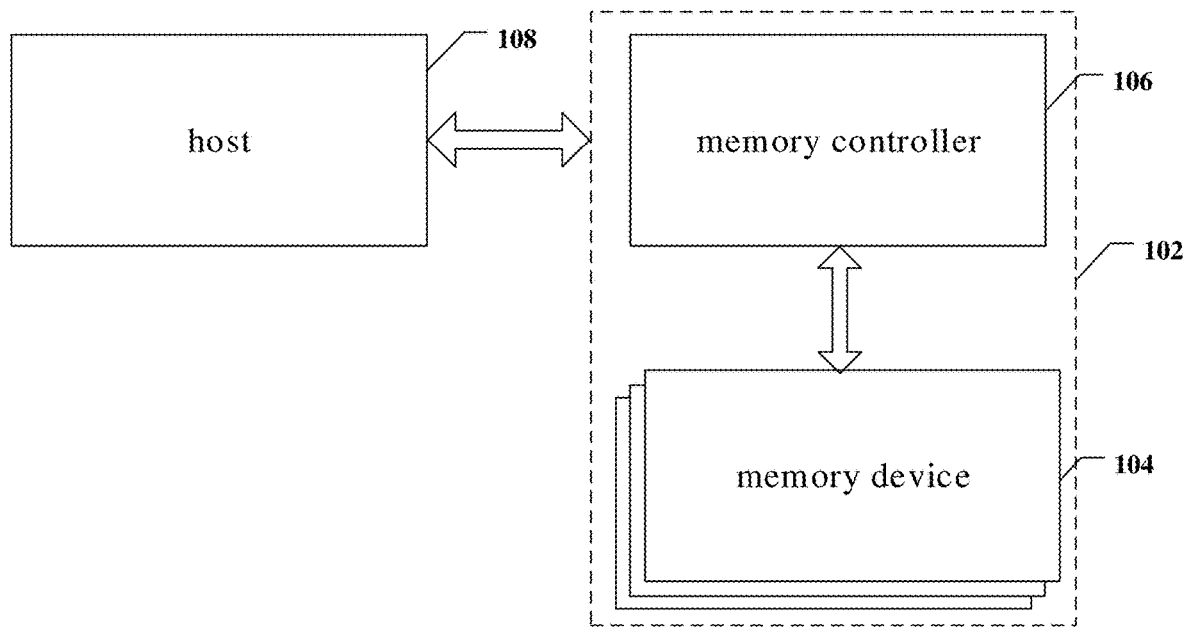
FIG. 1 is a schematic diagram of an example system having a memory system, according to an implementation of the present disclosure.

Example implementations of the present disclosure will be described in greater detail below with reference to the accompanying drawings. While example implementations of the present disclosure are shown in the accompanying drawings, it should be appreciated that the present disclosure can be implemented in various forms and should not be limited by the specific implementations set forth herein. Rather, these implementations are provided to develop a more thorough understanding of the present disclosure and to fully communicate the scope of the present disclosure to those skilled in the art.

As described below, many specific details are given to provide an understanding of the present disclosure. However, it is obvious to those skilled in the art that the present disclosure can be implemented without one or more of these details. In other examples, some technical features that are well-known in the art are not described in order to avoid confusion with the present disclosure. That is, all features of actual implementations are not described here, and functions and structures that are well-known are not described in detail.

In the accompanying drawings, the dimensions of the layers, zones, and elements, as well as their relative dimensions, may be exaggerated for the sake of clarity. Throughout the drawings, the same reference numerals indicate the same elements.

It should be appreciated that when an element or a layer is referred to as "on", "adjacent to", "connected to", or "coupled to" other elements or layers, it may be directly on, adjacent to, connected to, or coupled to other elements or layers, or there may be interposed elements or layers. Conversely, when an element is referred to as "directly on," "directly adjacent to," "directly connected to," or "directly coupled to" other elements or layers, there are no interposed elements or layers. It should be appreciated that, although the terms "first," "second," "third," and the like may be used to describe various elements, parts, zones, layers, and/or portions, these elements, parts, zones, layers, and/or portions should not be limited by these terms. These terms are used only to distinguish one element, part, zone, layer, or portion from another element, part, zone, layer, or portion. Thus, without departing from the teachings of this disclosure, the first element, part, zone, layer, or portion discussed below may be represented as a second element, part, zone, layer, or portion. When a second element, part, zone, layer, or portion is discussed, it does not mean that a first element, part, zone, layer, or portion necessarily exists in the present disclosure.

The spatial relationship terms such as "under", "below", "lower", "underneath", "on", "upper", etc. may be used herein for ease of description, and thereby used to describe the relationship of one element or feature shown in the drawings with other elements or features. It should be appreciated that, in addition to the orientations shown in the drawings, the spatial relationship terminology can be intended to include different orientations of the device in use and operation. For example, if the device in the accompanying drawings is turned over, then the element or feature described as "under" or "below" or "underneath" other elements can be oriented to be "on" the other elements or features. Thus, the example terms "under" and "below" may include both up and down orientations. The device may be oriented in other ways (rotated 90 degrees or in other orientations) and the spatial description terms used herein are interpreted accordingly.

The terms used herein is for the purpose of describing specific implementations only and is not a limitation of the present disclosure. When used herein, the singular forms "a", "an", and "the/that" can also be intended to include the plural forms, unless the context clearly indicates otherwise. It should be appreciated that, the terms "constituting" and/or "including", when used in this specification, can identify the presence of the features, integers, steps, operations, components and/or parts, but do not exclude the presence or addition of one or more other features, integers, steps, operations, components, parts, components and/or groups.

When used herein, the term "and/or" includes any and all combinations of the relevant listed items.

In order to provide a more detailed understanding of the features and technical aspects of implementations of the present disclosure, implementations of the present disclosure are described in detail below together with the accompanying drawings, which are provided for illustrative purposes only and are not intended to limit the implementations of the present disclosure.

FIG. 1 illustrates a block diagram of an example system 100 with memory in accordance with some aspects of the present disclosure. System 100 may be a mobile phone, desktop computer, laptop computer, tablet computer, vehicle computer, game console, printer, positioning device, wearable electronic device, smart sensor, virtual reality (VR) device, augmented reality device, or any other suitable electronic device having memory therein. As shown in FIG. 1, the system 100 may include a host 108 and a memory system 102 having one or more memory devices 104 and a memory controller 106. The host 108 may be a processor of an electronic device (e.g., the central processing unit) or a system-on-chip (e.g., an application processor). The host 108 may be configured to send data to or receive data from memory device 104.

The memory controller 106 is coupled to the memory device 104 and host 108, and is configured to control memory device 104, according to some implementations. The memory controller 106 may manage data stored in the memory device 104 and communicate with the host 108. In some implementations, the memory controller 106 is designed to operate in low duty cycle apparatuses, e.g., such as a secure digital card, compact flash card, USB flash drive, or other media. Additionally and/or alternatively, the memory controller 106 may be designed for use in electronic devices, e.g., such as personal calculators, digital cameras, mobile phones, and the like. In some implementations, the memory controller 106 is designed to operate in a high duty cycle SSD or embedded multimedia card, where the SSD or embedded multimedia card is/are used as a data storage and enterprise storage array for mobile devices, e.g., such as smart phones, tablet computers, laptops, and the like.

The memory controller 106 may be configured to control operations (e.g., such as read, erase, and program operations) of the memory device 104. The memory controller 106 may also be configured to manage various functions relating to data stored or to be stored in the memory device 104, including, but not limited to, bad block management, garbage collection, logic to physical address translation, wear leveling, and the like. In some implementations, the memory controller 106 is further configured to process error correction codes regarding data read from or written to the memory device 104. The memory controller 106 may also perform any other suitable function, e.g., such as formatting the memory device 104. The memory controller 106 may communicate with an external device (e.g., host 108) according to a specific communication protocol. For example, the memory controller 106 may communicate with the external device through at least one of various interface protocols, e.g., such as USB protocol, MMC protocol, peripheral component interconnect protocol, peripheral component interconnect express protocol, advanced technology attachment protocol, serial advanced technology attachment protocol, parallel advanced technology attachment protocol, small computer small interface protocol, enhanced small disk interface protocol, integrated drive electronic device protocol, firmware protocol, and the like.

Figure 2A:
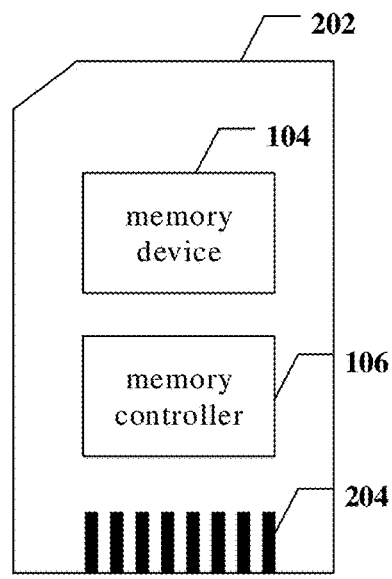
FIG. 2a is a schematic diagram of an example memory card having a memory system, according to an implementation of the present disclosure.
Figure 2B:
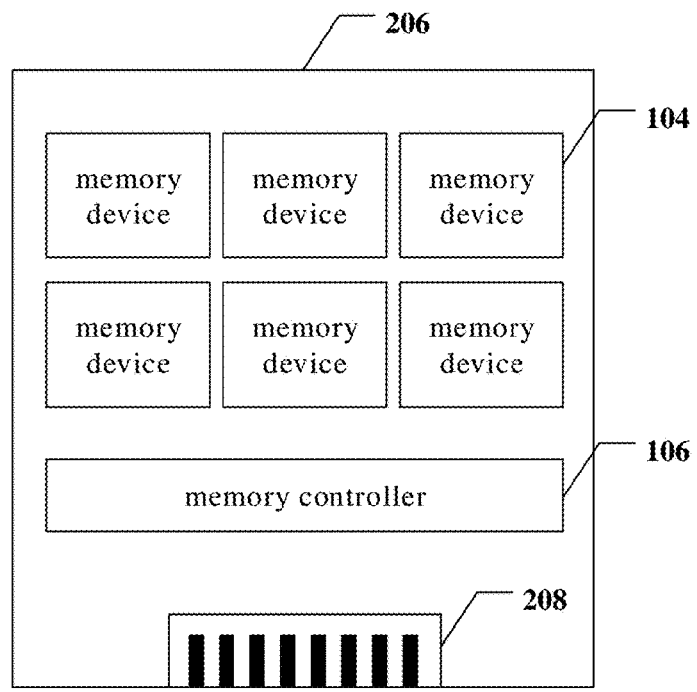
FIG. 2b is a schematic diagram of an example solid state drive having a memory system, according to an implementation of the present disclosure.

The memory controller 106 and one or more memory devices 104 may be integrated into various types of storage devices, e.g., included in the same package (e.g., universal flash storage (UFS) package or embedded multimedia card package). That is, the memory system 102 may be implemented and encapsulated in different types of terminal electronics. In an example, as shown in FIG. 2a, the memory controller 106 and a single memory device 104 may be integrated into the memory card 202. The memory card 202 may include a compact flash card, a smart media card, a memory stick, a multimedia card, a secure digital card, a UFS, and the like. The memory card 202 may also include a memory card connector 204 that couples the memory card 202 to a host (e.g., host 108 in FIG. 1). In another example as shown in FIG. 2b, the memory controller 106 and a plurality of memory devices 104 may be integrated into the SSD 206. The SSD 206 may also include an SSD connector 208 that couples the SSD 206 to a host (e.g., host 108 in FIG. 1). In some implementations, the storage capacity and/or operating speed of the SSD 206 is greater than those of the memory card 202.

Figure 3A:
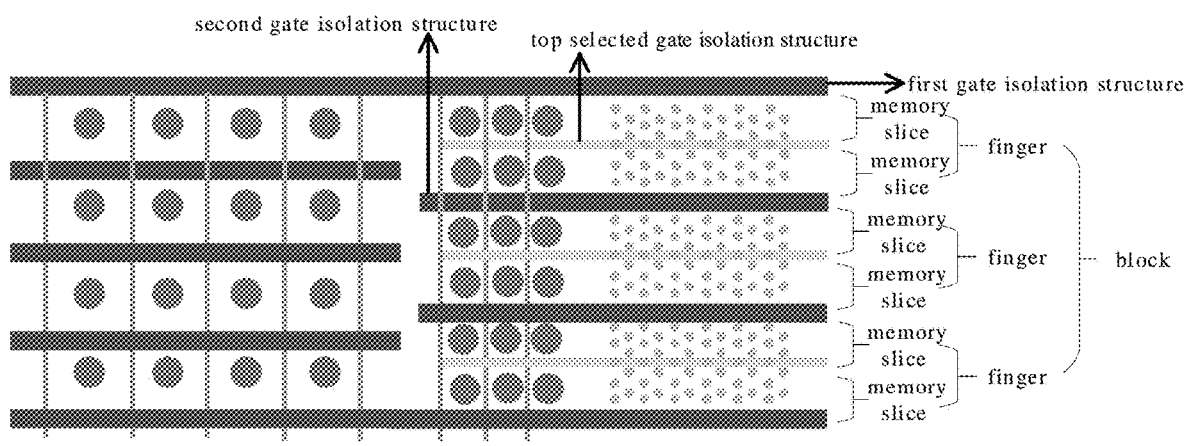
FIG. 3a is a schematic diagram of the distribution of memory cells of a three-dimensional NAND type memory, according to an implementation of the present disclosure.

FIG. 3a exemplarily shows a schematic diagram of the structure of a memory array of a three-dimensional NAND type memory. As shown in FIG. 3a, the memory array of the three-dimensional NAND type memory is composed of a plurality of parallel staggered rows of memory cell rows parallel to the gate isolation structure. Every four rows of memory cell rows are separated by the gate isolation structure and the top selected gate isolation structure. Each of the memory cell rows includes a plurality of memory cells. The gate isolation structure may include a first gate isolation structure that divides the memory array into a plurality of blocks and a second gate isolation structure that divides a block into a plurality of fingers. The top selected gate isolation structure provided in the middle of each finger may divide the finger into two parts so as to divide the finger into two memory slices. One block shown in FIG. 3a includes six memory slices. The number of memory slices in one block in practice is not limited thereto. A memory cell in a memory slice coupled by a word line may be called a page. The page may be a physical page.

It should be noted that the number of memory cell rows between the gate isolation structure and the top selected gate isolation structure shown in FIG. 3a is example only and is not intended to limit the number of memory cell rows included in one finger of the three-dimensional NAND type memory in the present disclosure. In practice, the number of memory cell rows contained in a finger may be adjusted according to the actual situation, such as 2, 4, 8, 16 and so on.

Figure 3B:
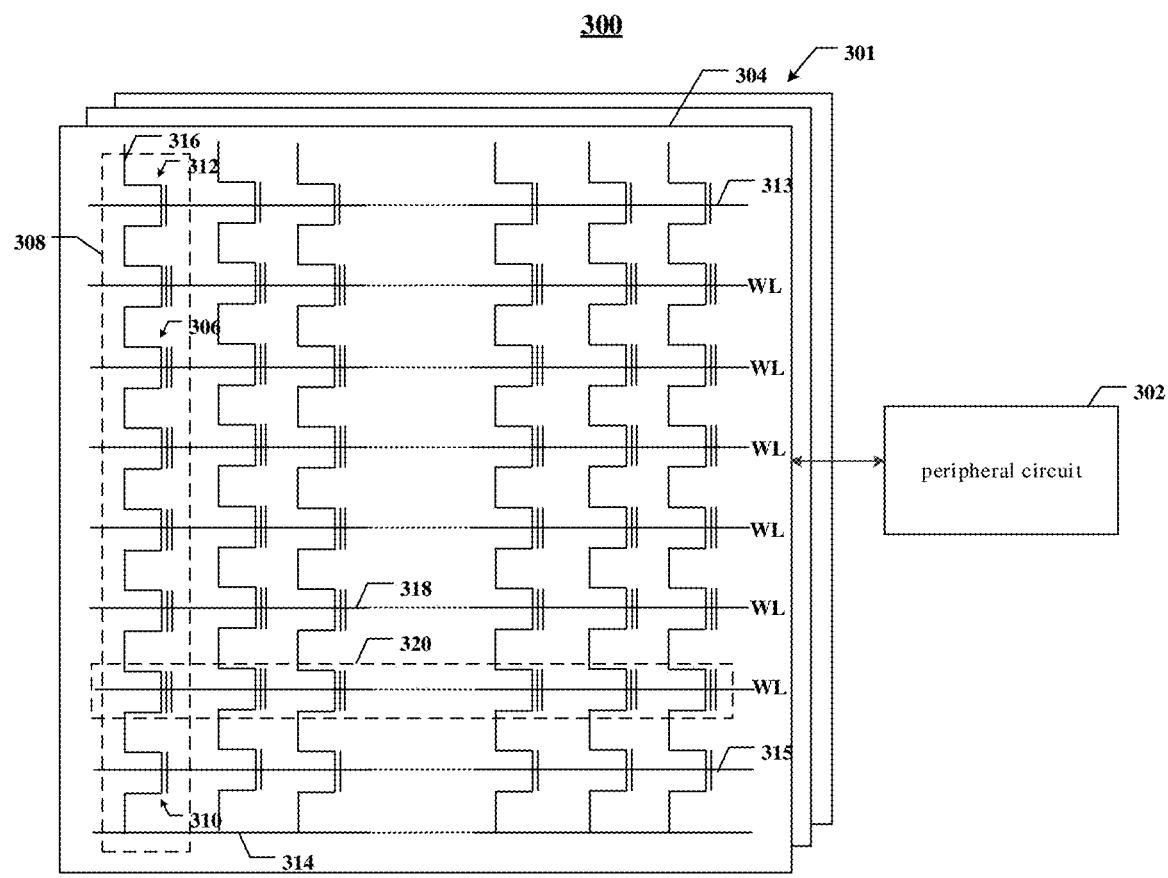
FIG. 3b is a schematic diagram of an example memory device including a peripheral circuit, according to an implementation of the present disclosure.

FIG. 3b shows a schematic circuit diagram of an example memory device 300 including a peripheral circuit according to some aspects of the present disclosure. The memory device 300 may be an example of memory device 104 in FIG. 1. The memory device 300 may include a memory array 301 and a peripheral circuit 302 coupled to the memory array 301. Take the memory array 301 as a three-dimensional NAND memory array as an example for description, in which memory cells 306 are NAND memory cells and provided in the form of an array of memory strings 308. Each memory string 308 may extend vertically above a substrate (not shown). In some implementation, each memory string 308 includes multiple memory cells 306 coupled in series and stacked vertically. Each memory cell 306 can hold a continuous analog value, e.g., a voltage or charge, that depends on a number of electrons trapped within an area of the memory cell 306. Each memory cell 306 may be a floating gate type memory cell including a floating gate transistor or a charge trapping type memory cell including a charge trapping transistor.

In some implementations, each memory cell 306 is a single level cell (SLC) having two possible memory states and therefore capable of storing one bit of data. For example, a first memory state "0" can correspond to a first voltage range, and a second memory state "1" can correspond to a second voltage range. In some implementations, each memory cell 306 may be a multi-level cells (MLC) capable of storing more than single bit of data in more than four memory states. For example, MLC can store two bits per cell and three bits per cell (also known as Triple-Level Cell (TLC)) or four bits per cell (also known as Quad-Level Cell (QLC)). Each MLC may be programmed to take a range of possible nominal stored values. In one example, if each MLC stores two bits of data, the MLC may be programmed to take one of three possible programming levels from the erased state by writing one of three possible nominal stored values to the cell. The fourth nominal stored value may be used for the erased state.

As shown in FIG. 3b, each memory string 308 may include a bottom selected transistor (BST) 310 at its source terminal and a top selected transistor (TST) 312 at its drain terminal. The BST 310 and TST 312 may be configured to activate the selected memory string 308 during read and program operations. In some implementations, the sources of the memory strings 308 in the same block 304 are coupled by the same source line (SL) 314 (e.g., a common SL). In another words, according to some implementations, all memory strings 308 in the same block 304 have an array common source (ACS). According to some implementations, the TST 312 of each memory string 308 is coupled to a respective bit line (BL) 316 from which data can be read or written via an output bus (not shown). In some implementations, each memory string 308 is configured to be selected or deselected by applying a select voltage (e.g., higher than the threshold voltage of the transistor having the TST 312) or a deselect voltage (e.g., 0V) to the respective TST 312 via one or more top selected line (TSL) 313 and/or by applying a select voltage (e.g., higher than the threshold voltage of the transistor having the BST 310) or a deselect voltage (e.g., 0V) to the respective BST 310 via one or more bottom selected line (BSL) 315.

As shown in FIG. 3b, the memory strings 308 can be organized into a plurality of blocks 304, each of the plurality of blocks 304 can have a common source line 314 (e.g., coupled to ground). In some implementations, each block 304 is a basic unit of data for an erase operation, i.e., all memory cells 306 on the same block 304 are erased at the same time. In order to erase the memory cells 306 in the selected block, the source lines 314 of the selected block and unselected blocks on the same plane as the selected block may be coupled with a bias using an erase voltage (Vers) (e.g., high positive voltage (e.g., 20V or higher)). It should be understood that in some examples, the erase operation can be performed at a half block level, at a quarter block level, or at any suitable number of blocks or any suitable fraction of blocks. The memory cells 306 of adjacent memory strings 308 can be coupled by word lines 318, and the word lines 318 select which row of memory cells 306 is affected by read and program operations. In some implementations, each word line 318 is coupled to a page 320 of memory cells 306. A size of the page 320 in bits can be related to a number of the memory strings 308 coupled by a word line 318 in one block 304. Each word line 318 can include a plurality of control gates (gate electrodes) at each memory cell 306 in a respective page 320 and a gate line coupling the control gates. With reference to the above FIG. 3a, a page 320 contains a plurality of memory cells 306 separated by a top selected gate isolation structure and a gate isolation structure. A plurality of memory cells between the top selected gate isolation structure and the gate isolation structure are arranged in a plurality of memory cell rows, with each memory cell row being parallel to the gate isolation structure and the top selected gate isolation structure. The memory cells in memory slices sharing the same word lines form programmable (read/write) pages.

Figure 4:
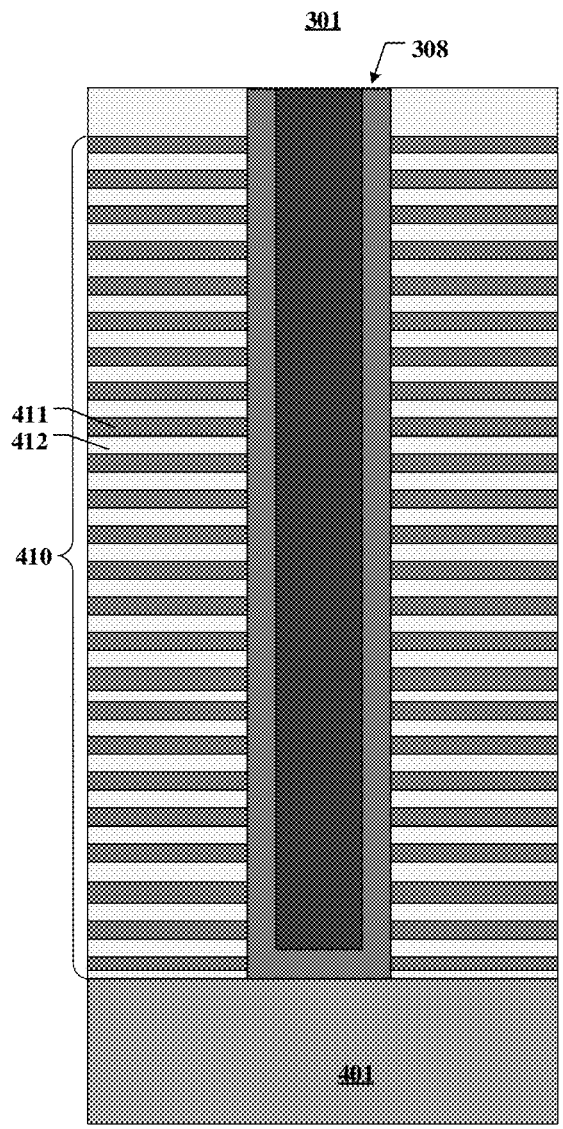
FIG. 4 is a schematic cross-sectional view of a memory array including a memory string, according to an implementation of the present disclosure.

FIG. 4 shows a schematic cross-sectional view of example memory array 301 including a memory string 308, according to some aspects of the present disclosure. As shown in FIG. 4, the memory string 308 may include a stacked structure 410 including a plurality of gate layers 411 and a plurality of insulating layers 412 alternately stacked in turn and a memory string 308 perpendicularly penetrating the gate layers 411 and the insulating layers 412. The gate layer 411 and the insulating layer 412 may be alternately stacked. Two adjacent gate layers 411 are separated by an insulating layer 412. The number of memory cells included in the memory array 301 is mainly related to the number of pairs of gate layers 411 and insulating layers 412 in the stacked structure 410.

The constituent material of the gate layer 411 may include a conductive material. The conductive material includes, but not limited to, tungsten (W), cobalt (Co), copper (Cu), aluminum (Al), polysilicon, doped silicon, silicide, or any combination thereof. In some implementations, each gate layer 411 includes a metal layer, for example, a tungsten layer. In some implementations, each gate layer 411 can include a doped polysilicon layer. Each gate layer 411 can include a control gate surrounding a memory cell. The gate layer 411 at the top of the stack structure 410 may extend laterally as a top selected gate line, and the gate layer 411 at the bottom of the stack structure 410 may extend laterally as a bottom selected gate line, and the gate layer 411 extending laterally between the top selected gate line and the bottom selected gate line may serve as a word line layer.

In some implementations, a stack structure 410 may be disposed on a substrate 401. The substrate 401 may include silicon (e.g., monocrystalline silicon), silicon germanium (SiGe), gallium arsenide (GaAs), germanium (Ge), silicon on insulator (SOI), germanium on insulator (GOI), or any other suitable material.

In some implementations, the memory string 308 includes a channel structure that extends vertically through the stack structure 410. In some implementations, the channel structure includes a channel hole filled with a semiconductor material(s) (e.g., as a semiconductor channel) and a dielectric material(s) (e.g., as a memory film). In some implementations, the semiconductor channel may include silicon, e.g., such as polysilicon. In some implementations, the memory film is a composite dielectric layer including a tunneling layer, a memory layer (also referred to as a "charge trapping/ storage layer") and a barrier layer. The channel structure may have a cylindrical shape (e.g., a pillar shape). According to some implementations, the semiconductor channel, the tunneling layer, the memory layer, and the barrier layer are arranged radially from the center of the pillar toward the outer surface of the pillar in this order. The tunneling layer may include silicon oxide, silicon oxynitride, or any combination thereof. The memory layer may include silicon nitride, silicon oxynitride, or any combination thereof. The barrier layer may include a silicon oxide, silicon oxynitride, high dielectric constant (high k) dielectric, or any combination thereof. In one example, the memory film may include a composite layer of silicon oxide/silicon oxynitride/silicon oxide (ONO).

Referring back to FIG. 3b, the peripheral circuit 302 can be coupled to the memory array 301 through the bit lines 316, the word lines 318, the source lines 314, the BSL 315, and the TSL 313. The peripheral circuit 302 can include any suitable analog, digital, and mixed-signal circuit for facilitating operations of the memory array 301 by applying and sensing voltage signals and/or current signals to and from each target memory cell 306 via the bit lines 316, the word lines 318, the source lines 314, the BSL 315, and the TSL 313. The peripheral circuit 302 can include various types of peripheral circuit formed using metal-oxide-semiconductor technology.

Figure 5:
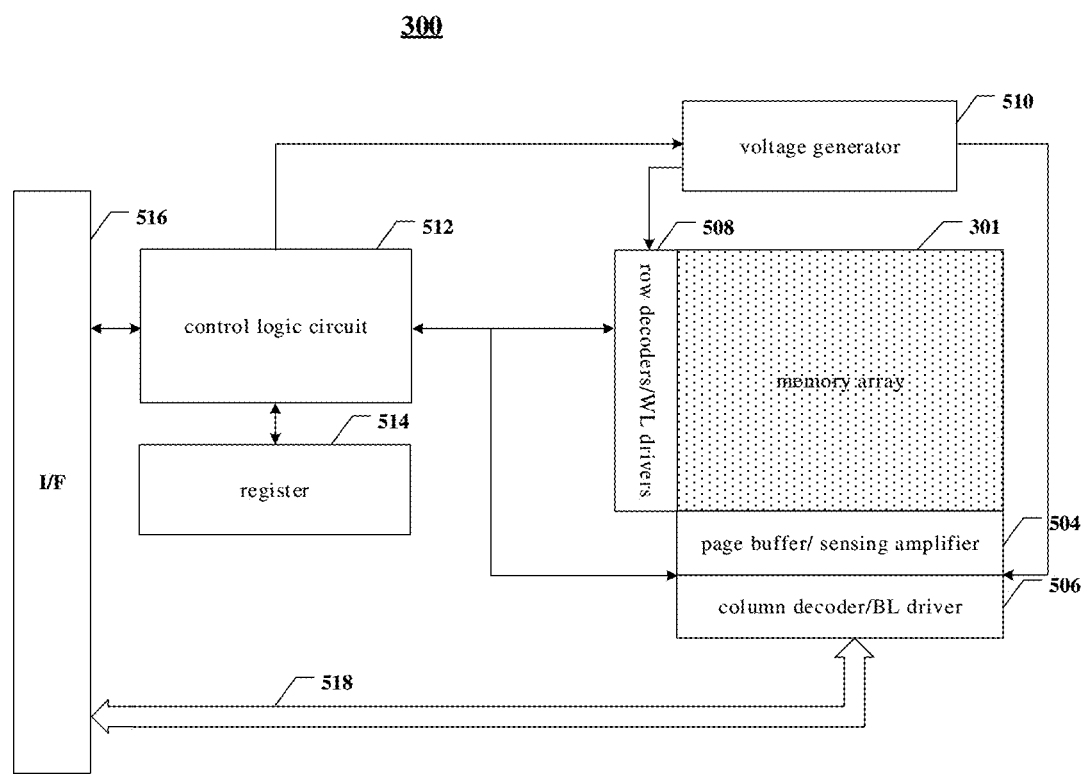
FIG. 5 is a schematic diagram of an example memory including a memory array and a peripheral circuit, according to an implementation of the present disclosure.

FIG. 5 shows some example peripheral circuits. Referring to FIG. 5, the peripheral circuit 302 includes page buffers/sense amplifiers 504, column decoders/bit line drivers 506, row decoders/word line drivers 508, voltage generators 510, control logic circuit 512, registers 514, interfaces 516, and data bus 518. It should be understood that, in some examples, additional peripheral circuits not shown in FIG. 5 can also be included.

Still referring to FIG. 5, the page buffer/sense amplifier 504 can be configured to read data from the memory array 301 and program (write) data to the memory array 301 based on a control signal from the control logic circuit 512. In one example, the page buffer/sense amplifier 504 can store a page of program data (write data) to be programmed into one page 320 of the memory array 301. In another example, the page buffer/sense amplifier 504 can perform a program verification operation to ensure that data has been properly programmed into the memory cells 306 coupled to the selected word lines 318. In yet another example, the page buffer/sense amplifier 504 can sense low power signals from the bit lines 316 representing data bits stored in memory cells 306 and amplify small voltage swings to recognizable logic levels in a read operation. The column decoder/bit line driver 506 can be configured to be controlled by the control logic circuit 512 and select one or more memory strings 308 by applying a bit line voltage generated from the voltage generator 510.

The row decoder/word line driver 508 can be configured to be controlled by the control logic circuit 512 and to select/deselect a block 304 of the memory array 301 and to select/deselect a word line 318 of the block 304. The row decoder/word line driver 508 can also be configured to drive the word line 318 using the word line voltage generated from the voltage generator 510. In some implementations, the row decoder/word line drivers 508 can also select/deselect and drive the BSL 315 and TSL 313. As described in detail below, the row decoder/word line driver 508 is configured to perform a program operation on the memory cells 306 coupled to the selected word line(s) 318. The voltage generator 510 can be configured to be controlled by the control logic circuit 512 and generate a word line voltage (e.g., a read voltage, a program voltage, a pass voltage, a local voltage, a verify voltage, etc.), a bit line voltage, and a source line voltage to be supplied to the memory array 301.

The control logic circuit 512 can be coupled to each of the peripheral circuits described above and configured to control the operation of each of the peripheral circuits. The registers 514 can be coupled to the control logic circuit 512 and include a status register, a command register, and an address register for storing status information, a command operation code (OP code), and a command address for controlling the operation of each peripheral circuit. Interface 516 can be coupled to the control logic circuit 512 and act as a control buffer to buffer and relay control commands received from a host (not shown) to the control logic circuit 512 and to buffer and relay status information received from the control logic circuit 512 to the host. The interface 516 can also be coupled to the column decoder/bit line drivers 506 via a data bus 518 and act as a data I/O interface and data buffer to buffer data and relay it to or from the memory array 301.

The memory devices in implementations of the present disclosure include, but are not limited to, a three-dimensional NAND type memory. For ease of understanding, take the three-dimensional NAND type memory as an example to describe the present disclosure.

As a kind of memory device that is more stable than traditional disk storage and provides more rapid data read and write operations, three-dimensional NAND memory is commonly used in user devices. In order to meet the increasing demand for storage, the size of three-dimensional NAND memory is shrinking, and the number of information bits in a single flash memory unit is increasing, the type of the memory cell used has shifted from SLC to one or more of MLC, TLC, and QLC. As a result, the error probability of flash memory is increasing. The Bose Chaudhuri Hocquenghem (BCH) error correction code is not enough to ensure the safety of data. The Low Density Parity Check (LDPC), as a way of error correction whose error correction ability approaches Shannon limit, is gradually replacing BCH and becoming a way of error correction encoding for the new generation of flash memory controllers.

In some implementations of the present disclosure, the decoder includes a posteriori probability storage module, a node message storage module and a message updating module. During updating the message (e.g., by way of using inter-block serial coding for a plurality of cyclic permutation matrices (CPM) in a layer of the check matrix corresponding to a frame of codewords), first-in, first-out (FIFO) is used in the message updating module to temporarily store relevant values of message transmitted to the check node by the variable node, and to temporarily store intermediate calculation values of message transmitted to the check node by the variable node corresponding to a layer of the check matrix. Because FIFO is a first-in, first-out memory, the data that is first input into FIFO will be the data that is first output. Thus, the input order of data is consistent with the output order. In this way, although the waiting period is eliminated, the update results corresponding to each layer of the check matrix still need to be sequentially output according to the input order of the message transmitted to the check node by the variable node in the message updating module. The lower degree-of-freedom is not conducive to subsequent optimization. In addition, the flag signal added by the decoder indicates that the posterior probability message used by the message transmitted to the check node by the variable node is new or old, which increases the complexity of control. An improvement to the throughput, the degree-of-freedom, and a simplified system implementation of is a problem for solving as it relates to existing technology.

Figure 6:
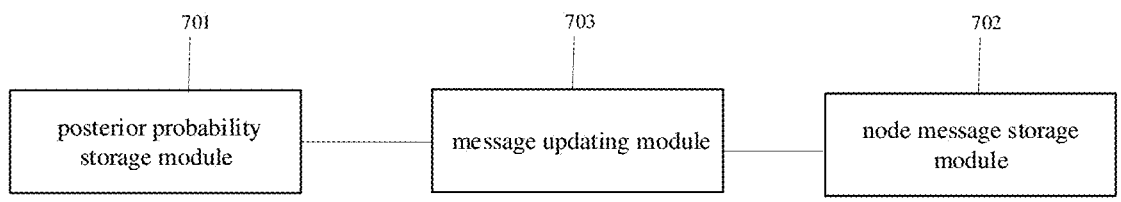
FIG. 6 is a schematic diagram of the frame structure of a decoder, according to an implementation of the present disclosure.

To overcome these and other challenges, the present disclosure provides an exemplary decoder, as shown in FIG. 6. For instance, the exemplary decoder may be configured to update a message by way of using inter-block serial coding for a plurality of cyclic permutation matrices in a layer of the check matrix corresponding to a frame of codewords. To that end, the decoder may include one or more of the following. For instance, in some implementations, the decoder may include a posteriori probability storage module 701 configured to: store the posterior probability message respectively corresponding to each of the cyclic permutation matrices. In some implementations, the decoder may include a node message storage module 702 configured to: store a message transmitted to a variable node by a check node respectively corresponding to each of the cyclic permutation matrices. In some implementations, the decoder may include a message updating module 703. The message updating module 703 may be configured to sequentially receive the posterior probability message and the message transmitted to the variable node by the check node respectively corresponding to each of the cyclic permutation matrices in a first order. The message updating module 703 may be configured to sequentially output the updated message transmitted to the variable node by the check node and updated posterior probability message respectively corresponding to each of the cyclic permutation matrices in the second order. The first order may be the same as or different from the second order.

Here, the posteriori probability storage module 701 is connected with the message updating module 703, which is connected with the node message storage module 702.

The decoder provided by the implementations of present disclosure includes a quasi-cyclic low density parity check code layered decoder. Table 1, shown below, lists a check matrix in an example.

implementation of the present disclosure. The decoder will be further described below in conjunction with FIG. 6, FIG. 7, FIG. 8, and Table 1.

In some implementations, the posteriori probability storage module 701 includes two real dual-port random access memories (RAM).

RD1 and RD2 (e.g., shown in FIG. 7) are two read ports of the posteriori probability storage module 701, and WR1 and WR2 are two write ports of the posteriori probability storage module 701.

The posterior probability message stored in the posteriori probability storage module in the first iteration is a log-likelihood ratio (LLR) message.

In some implementations, the depth of each real dual-port RAM in the posteriori probability storage module 701 is nb, and the width is the width of a posterior probability message*cmp_size. As an example, the width of a posterior probability message of one node is quantized to 8 bit, and then the width is 8*5=40 bit. The depth of the posteriori probability storage module 701 is 4. Address 0 stores a posterior probability message LLR ($y_0$, $y_1$, $y_2$, $y_3$, $y_4$) of $v_0$~$v_4$ with a total of 40 bit. Address 1 stores a posterior probability message LLR ($y_5$, $y_6$, $y_7$, $y_8$, $y_9$) of a node of $v_5$~$v_9$. Address 2 stores a posterior probability message LLR

TABLE 1

|     | v0 | v1 | v2 | v3 | v4 | v5 | v6 | v7 | v8 | v9 | v10 | v11 | v12 | v13 | v14 | v15 | v16 | v17 | v18 | v19 |
|-----|----|----|----|----|----|----|----|----|----|----|-----|-----|-----|-----|-----|-----|-----|-----|-----|-----|
| c0  | 0  | 1  | 0  | 0  | 0  | 0  | 0  | 1  | 0  | 0  | 0   | 0   | 0   | 0   | 0   | 1   | 0   | 0   | 0   | 0   |
| c1  | 0  | 0  | 1  | 0  | 0  | 0  | 0  | 0  | 1  | 0  | 0   | 0   | 0   | 0   | 0   | 0   | 1   | 0   | 0   | 0   |
| c2  | 0  | 0  | 0  | 1  | 0  | 0  | 0  | 0  | 0  | 1  | 0   | 0   | 0   | 0   | 0   | 0   | 0   | 1   | 0   | 0   |
| c3  | 0  | 0  | 0  | 0  | 1  | 1  | 0  | 0  | 0  | 0  | 0   | 0   | 0   | 0   | 0   | 0   | 0   | 0   | 1   | 0   |
| c4  | 1  | 0  | 0  | 0  | 0  | 0  | 1  | 0  | 0  | 0  | 0   | 0   | 0   | 0   | 0   | 0   | 0   | 0   | 0   | 1   |
| c5  | 0  | 0  | 1  | 0  | 0  | 1  | 0  | 0  | 0  | 0  | 0   | 1   | 0   | 0   | 0   | 0   | 0   | 0   | 0   | 0   |
| c6  | 0  | 0  | 0  | 1  | 0  | 0  | 1  | 0  | 0  | 0  | 0   | 0   | 1   | 0   | 0   | 0   | 0   | 0   | 0   | 0   |
| c7  | 0  | 0  | 0  | 0  | 1  | 0  | 0  | 1  | 0  | 0  | 0   | 0   | 0   | 1   | 0   | 0   | 0   | 0   | 0   | 0   |
| c8  | 1  | 0  | 0  | 0  | 0  | 0  | 0  | 0  | 1  | 0  | 0   | 0   | 0   | 0   | 1   | 0   | 0   | 0   | 0   | 0   |
| c9  | 0  | 1  | 0  | 0  | 0  | 0  | 0  | 0  | 0  | 1  | 1   | 0   | 0   | 0   | 0   | 0   | 0   | 0   | 0   | 0   |
| c10 | 0  | 0  | 0  | 0  | 0  | 0  | 1  | 0  | 0  | 0  | 0   | 0   | 0   | 0   | 0   | 0   | 1   | 0   | 0   | 0   |
| c11 | 0  | 0  | 0  | 0  | 0  | 0  | 0  | 1  | 0  | 0  | 0   | 0   | 0   | 0   | 0   | 0   | 0   | 1   | 0   | 0   |
| c12 | 0  | 0  | 0  | 0  | 0  | 0  | 0  | 0  | 1  | 0  | 0   | 0   | 0   | 0   | 0   | 0   | 0   | 0   | 1   | 0   |
| c13 | 0  | 0  | 0  | 0  | 0  | 0  | 0  | 0  | 0  | 1  | 0   | 0   | 0   | 0   | 0   | 0   | 0   | 0   | 0   | 1   |
| c14 | 0  | 0  | 0  | 0  | 0  | 1  | 0  | 0  | 0  | 0  | 0   | 0   | 0   | 0   | 0   | 1   | 0   | 0   | 0   | 0   |

Referring to Table 1, the number of layers of the check matrix in Table 1 is mb=3, the number of columns is nb=4, the size of a cyclic permutation matrix is cmp_size=5, and the total weight of the base matrix is 8, where the 8 non-zero submatrices are sequentially numbered 1-8 in the order from top to bottom and from left to right. Here, the non-zero submatrix 1-3 and the first all-zero submatrix from top to bottom constitute the first layer. The non-zero submatrix 4-6 and the second all-zero submatrix from top to bottom constitute the second layer. The non-zero submatrix 7-8 and the third all-zero submatrix and the fourth all-zero submatrix from top to bottom constitute the third layer. Non-zero submatrix 1, non-zero submatrix 4, and the first all-zero submatrix from left to right constitute the first column. The non-zero submatrix 2, non-zero submatrix 5, and non-zero submatrix 7 constitute the second column. Other columns are similar and will not be repeated again. Here, v0-v19 are the variable node message corresponding to each column, and c0-c14 are the check node message corresponding to each row.

Figure 7:
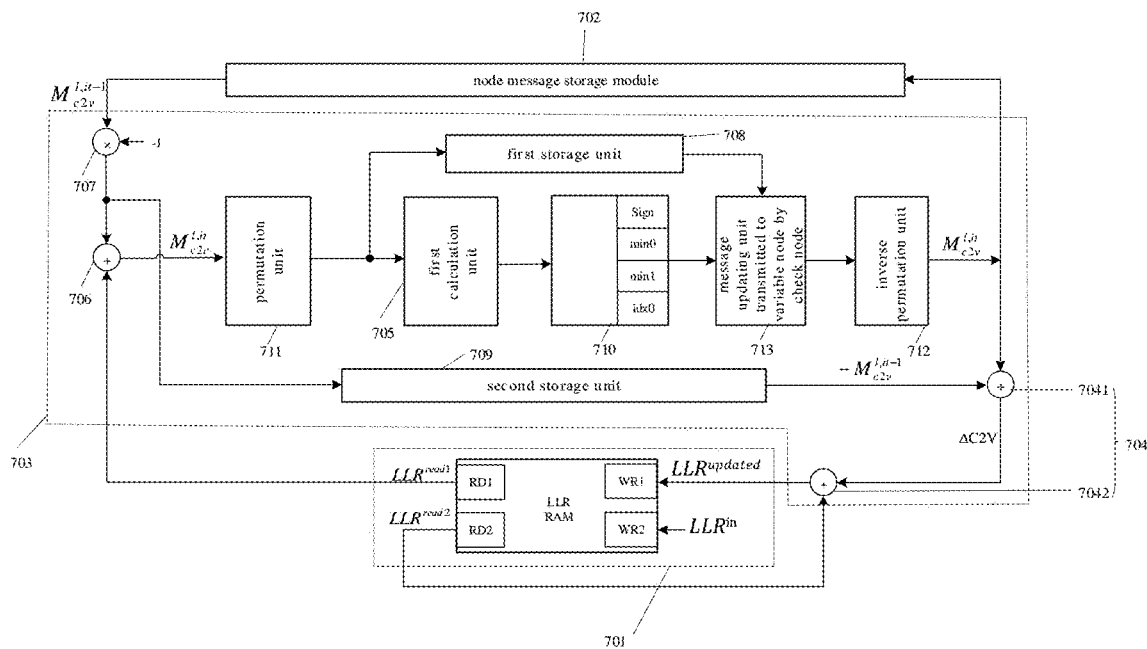
FIG. 7 is a schematic structural diagram of a decoder, according to an implementation of the present disclosure.
Figure 8:
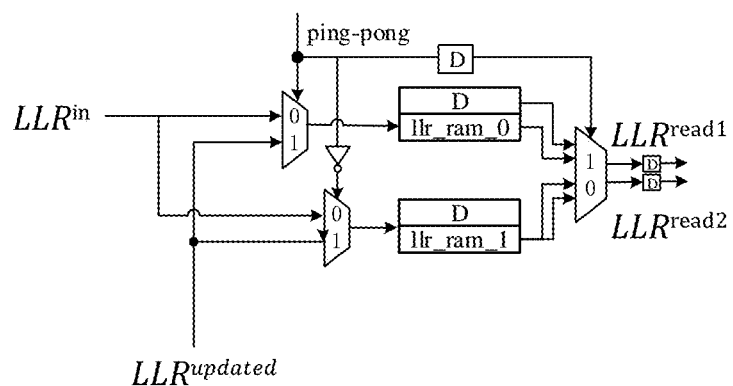
FIG. 8 is a schematic structural diagram of a posterior probability storage module, according to an implementation of the present disclosure.

FIG. 7 is a schematic diagram of the architecture of a decoder provided by the implementation of the present disclosure. FIG. 8 is a schematic structural diagram of a posteriori probability storage module 701 provided by the ($y_{10}$, $y_{11}$, $y_{12}$, $y_{13}$, $y_{14}$) of a node of $v_{10}$~$v_{14}$. Address 3 stores a posterior probability message LLR ($y_{15}$, $y_{16}$, $y_{17}$, $y_{18}$, $y_{19}$) of a node of $v_{15}$~$v_{19}$.

At the beginning of coding, ping pong signal is set to 0, $LLR^{in}$ inputs the initial channel message to llr_ram_0. When nb initial channel message is/are buffered, ping pong is reversed. During coding, the updated posterior probability message, i.e., $LLR^{updated}$, is stored in llr_ram_0, and the initial channel message of the second frame of code words are stored in llr_ram_1.

It can be understood that the posteriori probability storage module 701 in the implementations of the present disclosure includes two real dual-port RAMs, e.g., one for coding the current code word, and the other for storing the initial channel message of the next frame of code words. The reading and writing operations can be performed independently. The next layer of the check matrix can directly read the current posterior probability message during coding. It is not determined whether the posterior probability message is old or new, thus simplifying the coding architecture without the calculation of the old and new flags.

In some examples, the node message storage module 702 includes a simple dual-port RAM, the depth is the total weight of the base matrix, and the width is the width of a message (C2V message) of a check node transmitted to the variable node by the check node*cmp_size. For example, the width of a C2V message of a check node is quantized to 6 bits, and the depth of the node message storage module 702 is 8. Address 0 can access the C2V message of non-zero sub-matrix 1, and the width is 6*5=30 bits, including five check node message transmitted to $v_1$ by $c_4$, to $v_1$ by $c_0$, to $v_2$ by $c_1$, to $v_3$ by $c_2$, to $v_4$ by $c_3$. Address 1 can access the C2V message of non-zero sub-matrix 2, and the width 30 bits includes the check node message transmitted to $v_5$ by $c_3$, to $v_6$ by $c_4$, to $v_7$ by $c_0$, to $v_8$ by $c_1$, to $v_9$ by $c_2$. Addresses 2~7 store the C2V message of non-zero sub-matrix 3~8, respectively. The message output from the node message storage module 702 to the message updating module 703 is $M_{c2v}^{l,it-1}$, as shown in FIG. 7.

In some examples, the message updating module 703 includes a fourth calculation unit 707 configured to inverse the message transmitted to the variable node by the check node in the node message storage module 702, thereby obtaining a negative latest message transmitted to the variable node by the check node respectively corresponding to each cyclic permutation matrix. The order of inputting data into the fourth calculation unit 707 and the order of outputting data are the same, e.g., both are in the first order. In some examples, the fourth calculation unit 707 may be a multiplier.

Taking the first layer of the check matrix in Table 1 as an example, when the order of the cyclic permutation matrix corresponding to the input data in the fourth calculation unit 707 is, e.g., non-zero submatrix 2→non-zero submatrix 1→non-zero submatrix 3. The order of the cyclic permutation matrix corresponding to the output data from the fourth calculation unit 707 is non-zero submatrix 2→non-zero submatrix 1→non-zero submatrix 3.

In some implementations, the message updating module 703 may further include a third calculation unit 706.

The third calculation unit 706 may be configured to sequentially receive the latest posterior probability message respectively corresponding to each of the cyclic permutation matrices stored in the posteriori probability storage module 701 in a first order. The third calculation unit 706 may be configured to sequentially receive the latest negative message transmitted to the variable node by the check node respectively corresponding to each of the cyclic permutation matrices stored in the node message storage module 702 in the first order. The third calculation unit 706 may be configured to sequentially output the message transmitted to the check node by the variable node respectively corresponding to each of the cyclic permutation matrices in the first order.

Here, the message calculated from the third calculation unit 706 is $M_{v2c}^{l,it}$, as shown in FIG. 7, which is a message transmitted to the check node by the variable node corresponding to a plurality of cyclic permutation matrices in a layer of the check matrix.

In some implementations, the message updating module 703 may include a permutation unit 711. The permutation unit 711 may be configured to sequentially arrange the sequence of message transmitted to the check node by the variable node corresponding to each of the cyclic permutation matrices output by the third calculation unit 706, according to the order of the corresponding check node permuted from the order of the variable node.

In some examples, the permutation unit 711 includes a barrel shifter that can cyclic shift the input message vector, so that the first calculation unit 705 calculates the minimum value and the sub-minimum value of the non-zero element in a row. As an example, the message (V2C message) transmitted to the check node by the variable node corresponding to the non-zero submatrix 1 is LLR ($v_0 2c_4$, $v_1 2c_0$, $v_2 2c_1$, $v_3 2c_2$, $v_4 2c_3$), the V2C message corresponding to the non-zero submatrix 2 is LLR ($v_5 2c_3$, $v_6 2c_4$, $v_7 2c_0$, $v_8 2c_1$, $v_9 2c_2$), and the V2C message corresponding to the non-zero submatrix 3 is LLR ($v_{15} 2c_0$, $v_{16} 2c_1$, $v_{17} 2c_2$, $v_{18} 2c_3$, $v_{19} 2c_4$). The shift factor of the non-zero submatrix may not be 0, thus the V2C message should be cyclic shifted, and the V2C message vectors corresponding to the non-zero element of the check matrix are aligned to be calculated.

In other words, the V2C message corresponding to the non-zero submatrix 1 is LLR ($v_0 2c_4$, $v_1 2c_0$, $v_2 2c_1$, $v_3 2c_2$, $v_4 2c_3$), and should be cyclic shifted to the left by 1 to become LLR ($v_1 2c_0$, $v_2 2c_1$, $v_3 2c_2$, $v_4 2c_3$, $v_0 2c_4$) to output. The V2C message corresponding to the non-zero submatrix 2 is LLR ($v_5 2c_3$, $v_6 2c_4$, $v_7 2c_0$, $v_{8v\,sdv} 2c_1$, $v_9 2c_2$), and should be cyclic shifted to the left by 2 to become LLR ($v_7 2c_0$, $v_8 2c_1$, $v_9 2c_2$, $v_5 2c_3$, $v_6 2c_4$) to output. The V2C message corresponding to the non-zero submatrix 3 is LLR ($v_{15} 2c_0$, $v_{16} 2c_1$, $v_{17} 2c_2$, $v_{18} 2c_3$, $v_{19} 2c_4$), and should be cyclic shifted to the left by 0 to become LLR ($v_{15} 2c_0$, $v_{16} 2c_1$, $v_{17} 2c_2$, $v_{18} 2c_3$, $v_{19} 2c_4$) to output.

In some implementations, the message updating module 703 may include a first storage unit 708 and a second storage unit 709.

The first storage unit 708 may be configured to store symbol values of the message transmitted to the check node by the variable node corresponding to a plurality of the cyclic permutation matrices. The first storage unit 708 is provided with a first read address and a first write address. The first storage unit 708 sequentially inputs the symbol values of the message transmitted to the check node by the variable node respectively corresponding to each of the cyclic permutation matrices in the first order through the first write address. The first storage unit 708 sequentially outputs the symbol values of the message transmitted to the check node by the variable node respectively corresponding to each of the cyclic permutation matrices in the second order through the first read address.

The second storage unit 709 may be configured to store the latest negative message transmitted to the variable node by the check node corresponding to the plurality of cyclic permutation matrices stored in the node message storage module 702. The second storage unit 709 is provided with a second read address and a second write address. The second storage unit 709 sequentially inputs the latest negative message transmitted to the variable node by the check node respectively corresponding to each of the cyclic permutation matrices stored in the node message storage module 702 in the first order through the second write address. The second storage unit 709 sequentially outputs latest negative message transmitted to the variable node by the check node respectively corresponding to each of the cyclic permutation matrices stored in the node message storage module 702 in the second order through the second read address.

In some implementations, the first storage unit 708 and the second storage unit 709 both include a random access memory.

In some examples, the first storage unit 708 and the second storage unit 709 include a simple dual-port RAM.

It should be noted that the first memory unit 708 and the second memory unit 709 are not limited to the random access memory proposed in the above implementations, and may also be other memories containing read addresses and write addresses.

Here, the first storage unit 708 stores symbol values of a message transmitted to the check node by the variable node corresponding to a plurality of cyclic permutation matrices permutated by the permutation unit 711. The second storage unit 709 stores a negative C2V message, i.e., $-M_{c2v}^{l,it-1}$, as shown in FIG. 7, and outputs a value in the second calculation unit 704 to participate in the calculation. Since the updated C2V message has not been rewritten to the node message storage module 702, the node message updating module 703 stores an old C2V message of a frame of code words in last iteration, so that the second storage unit 709 stores a negative C2V message in last iteration.

It is understood that since the RAM has a read address and a write address, data can be written to or read from any location in the RAM. The first storage unit 708 provided in the implementations of present disclosure has a first read address and a first write address, so that the first storage unit 708 can write the V2C message corresponding to any cyclic permutation matrix in a layer, and so that the first storage unit 708 can freely output the symbol value read from the V2C message corresponding to any cyclic permutation matrix in a layer. Therefore, when updating the C2V message, the output order of the updated C2V message outputting any cyclic permutation matrix can be determined, providing an optimized degree-of-freedom. The second memory unit 709 has a second read address and a second write address, so that the second memory unit 709 can write a negative C2V message corresponding to any cyclic permutation matrix in a layer, and so that the second memory unit 709 can freely output a negative C2V message corresponding to any cyclic permutation matrix in a layer. Therefore, when updating a posterior probability message, the output order of a posterior probability message corresponding to any cyclic permutation matrix in a layer outputting a check matrix can be determined.

In some implementations, the depth of the first storage unit 708 is the total weight of a quasi-cyclic low-density parity check code base matrix, and the width thereof is the product of the size of a cyclic permutation matrix and the width of the message of a check node transmitted to the variable node by the check node. The depth of the second storage unit 709 is the total weight of the quasi-cyclic low-density parity check code base matrix. The width thereof is the size of a cyclic permutation matrix.

In some implementations, the message updating module 703 may further include a first calculation unit 705 and a message updating unit 713 transmitted to the variable node by the check node. The first calculation unit 705 may be configured to calculate a minimum value, a sub-minimum value and a symbol XOR value corresponding to a layer of the check matrix. The message updating unit 713 transmitted to the variable node by the check node may be configured to sequentially receive the symbol value of the message transmitted to the check node by the variable node respectively corresponding to each of the cyclic permutation matrices stored in the first storage unit 708 in the second order, receive the minimum value, the sub-minimum value and the symbol XOR value corresponding to a layer of the check matrix calculated by the first calculation unit 705. The message updating unit 713 transmitted to the variable node by the check node may be configured to sequentially output the updated message transmitted to the variable node by the check node respectively corresponding to each of the cyclic permutation matrices in the second order.

In some examples, the message update module 703 may further include a third storage unit 710 configured to buffer the minimum value, the sub-minimum value, the symbol XOR value corresponding to a layer of the check matrix calculated by the first calculation unit 705.

In some examples, the third storage unit 710 includes a FIFO.

In some examples, the first calculation unit 705 may calculate the minimum value and the sub-minimum value of the V2C message corresponding to a layer of the check matrix according to the V2C message output by the permutation unit 711. The first calculation unit 705 may output the column position where the minimum value is located. After the permutated V2C message corresponding to the first layer cyclic permutation matrix is output, the minimum value, the column location, the sub-minimum value, and the symbol XOR value of the V2C message corresponding to the first layer can be obtained and output into the third storage unit 710. In some examples, the message updating unit 713 transmitted to the variable node by the check node may read the minimum value, column location, the sub-minimum value, and the symbol XOR value of the variable node corresponding to a layer of the check matrix buffered by the third storage unit 710, at the same time may read the symbol value of V2C message in the first storage unit 708. It is determined whether the current node is the minimum value based on the data read from the first storage unit 708 and the data read from the third storage unit 710. If it is determined that the current node is the minimum value, the check node message is assigned with the sub-minimum value. Otherwise, the check node message is assigned with the minimum value. The updated C2V message corresponding to the first layer of the check matrix are respectively LLR ($c_0 2v_1$, $c_1 2v_2$, $c_2 2v_3$, $c_3 2v_4$, $c_4 2v_0$), LLR ($c_0 2v_7$, $c_1 2v_8$, $c_2 2v_9$, $c_3 2v_5$, $c_4 2v_{-6}$) and LLR ($c_0 2v_{15}$, $c_1 2v_{16}$, $c_2 2v_{17}$, $c_3 2v_{18}$, $c_4 2v_{19}$).

In some implementations, the message updating module 703 may further include an inverse permutation unit 712. The inverse permutation unit 712 may be configured to arrange the sequence of updated message transmitted to the variable node by the check node respectively corresponding to each of the cyclic permutation matrices, which are output in the second order by the message updating unit 713 transmitted to the variable node by the check node, according to the order of the corresponding variable node permuted from the order of the check node.

It is understood that the inverse permutation unit 712 here performs cyclic shifting of the message output by the message updating unit 713 transmitted to the variable node by the check node. The shift values of the inverse permutation unit 712 and the permutation unit 711 are added to the size of a cyclic permutation matrix.

In some examples, the inverse permutation unit 712 cyclic shifts the message transmitted to the variable node by the check node output by the message updating unit 713 transmitted to the variable node by the check node. The LLR ($c_0 2v_1$, $c_1 2v_2$, $c_2 2v_3$, $c_3 2v_4$, $c_4 2v_0 0$) corresponding to the non-zero submatrix 1 is cyclic shifted to the left by 4 to become LLR ($c_4 2v_0$, $c_0 2v_1$, $c_1 2v_2$, $c_2 2v_3$, $c_3 2v_4$). The LLR ($c_0 2v_7$, $c_1 2v_8$, $c_2 2v_9$, $c_3 2v_5$, $c_4 2v_6$) corresponding to non-zero submatrix 2 is cyclic shifted to the left by 3 to become LLR ($c_3 2v_5$, $c_4 2v_6$, $c_0 2v_7$, $c_1 2v_8$, $c_2 2v_9$). The LLR ($c_0 2v_{15}$, $c_1 2v_{16}$, $c_2 2v_{17}$, $c_3 2v_{18}$, $c_4 2v_{19}$) corresponding to non-zero submatrix 3 is cyclically shifted to the left by 0 to become LLR ($c_0 2v_{15}$, $c_1 2v_{16}$, $c_2 2v_{17}$, $c_3 2v_{18}$, $c_4 2v_{19}$).

The message output from the inverse permutation unit 712 here is an updated C2V message corresponding to a layer of the check matrix, i.e., $M_{c2v}^{l,it}$ as shown in FIG. 7. One part of the message output from the inverse permutation unit 712 enters the node storage module 702, and the other enters the second calculation unit 704 to participate in the calculation.

In some implementations, the message updating module 703 may include a second calculation unit 704. The second calculation unit 704 may be configured to sequentially output the updated posterior probability message respectively corresponding to each of the cyclic permutation matrices in the second order based on the message corresponding to each of the cyclic permutation matrices obtained from the permutation by the inverse permutation unit 712, the message corresponding to each of the cyclic permutation matrices stored in the second storage unit 709, and the message corresponding to each of the cyclic permutation matrices stored in the posteriori probability storage module 701.

Here, the second calculation unit 704 includes a first sub-calculation unit 7041 and a second sub-calculation unit 7042. The first sub-calculation unit 7041 may be configured to add $-M_{c2v}^{l,it-1}$ and $M_{c2v}^{l,it}$ to get $\Delta C2V$. The second sub-calculation unit 7042 may be configured to add $\Delta C2V$ and the posteriori probability message stored in the posteriori probability storage module 701 to get updated posterior probability message $LLR^{updated}$.

In some examples, the first sub-calculation unit 7041 and the second sub-calculation unit 7042 may include adders.

In some implementations, the receiving order in which the message updating module 703 receives the message respectively corresponding to each of the cyclic permutation matrices is a first order, and the outputting order in which the message updating module 703 outputs the message respectively corresponding to each cyclic permutation matrix is a second order. The first order and the second order can be the same or different, so that the output order of the message corresponding to any cyclic permutation matrix in a layer of the check matrix can be freely selected, and the degree-of-freedom is improved, which is beneficial to the optimization of convergence time and the improvement of throughput.

Based on the above decoder, a memory controller may include the decoder according to any one of above implementations is provided by the implementations of present disclosure.

Based on the above memory controller, a memory system may include the memory controller of above implementations and a memory device coupled to the memory controller is provided by the implementations of present disclosure.

FIG. 9 illustrates a block diagram of a memory system 601 that includes a memory controller 602 and a memory device 603. The memory controller 602 is configured to control the memory device 603 to perform read and write operations. The memory controller 602 and the memory device 603 may be coupled in any suitable way. The memory controller 602 includes a control unit (CPU) 608, a data buffer 609, an error correction module 606, a host I/F 605, and a memory I/F 607. The memory device 603 in the implementations of the present disclosure may be a non-volatile semiconductor memory for storing data, such as a NAND type memory. A memory system 601 is connected to a host 604. The host I/F 605 outputs command received from the host 604, valid data (write data) and so on to the internal bus 610, and transmits the valid data (read data) read from the memory device 603, the response from the control unit 608 to the host 604.

The control unit 608 may instruct the memory I/F 607 to write the valid data and the parity check data and check matrix to the memory device 603 according to the command from the host 604. In addition, the control unit may instruct the memory I/F 607 to read the valid data and the parity check data, check matrix from the memory device according to the command from the host 604.

The error correction module 606 includes an encoding unit and a decoding unit. The encoding unit encodes the valid data of a predetermined size written to generate parity check data (e.g., an LDPC) and the corresponding check matrix. The parity check data and the corresponding check matrix generated by the encoding unit can be stored in the memory device. The decoding unit performs decoding using the parity check data and the corresponding check matrix. The decoding unit includes a decoder. When decoding, the parity check code and the corresponding check matrix can be obtained from the memory device.

Based on the above memory system, an electronic device that includes a decoder as described in any of the above implementations and a memory device coupled to the decoder may be provided according to some implementations.

The decoder may be built into the memory controller, and may not be built into the memory controller but instead provided outside the memory controller.

The structure and composition of the memory controller, memory system, electronic device can be referred to the foregoing detailed description of FIG. 1, FIG. 2a, FIG. 2b, FIG. 3a, FIG. 3b, FIG. 4, and FIG. 5, which are not repeated for the sake of brevity.

Based on the above decoder, a coding method for the layered coding of the quasi-cyclic low density parity check code is also provided by the implementations of the present disclosure. During updating the message by way of using inter-block serial coding for a plurality of cyclic permutation matrices in a layer of the check matrix corresponding to a frame of codewords, as shown in FIG. 10, the method may include one more of the following.

For instance, the method may include storing the posterior probability message using a posterior probability storage module. The method may include storing the message transmitted to a variable node by a check node using a node message storage module. The method may include sequentially receiving, using a message updating module, the latest posterior probability message respectively corresponding to each of the cyclic permutation matrices stored in the posterior probability storage module in a first order. The method may include sequentially receiving using the message updating module, the latest message transmitted to the variable node by the check node respectively corresponding to each of the cyclic permutation matrices stored in the node message storage module in the first order. The method may include sequentially outputting, using the message updating module, the updated message transmitted to the variable node by the check node respectively corresponding to each of the cyclic permutation matrices in the second order. The method may include sequentially outputting, using the message updating module, the updated posterior probability message respectively corresponding to each of the cyclic permutation matrices in the second order. The first order may be the same as or different from the second order.

In some implementations, the sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order may include, e.g., sequentially receiving, using a third calculation unit, the latest posterior probability message respectively corresponding to each of the cyclic permutation matrices stored in the posterior probability storage module in a first order. In some implementations, the sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order may include, e.g., sequentially receiving, using the third calculation unit, the latest negative message transmitted to the variable node by the check node respectively corresponding to each of the cyclic permutation matrices stored in the node message storage module in the first order. In some implementations, the sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order may include, e.g., sequentially outputting, using the third calculation unit, the message transmitted to the check node by the variable node respectively corresponding to each of the cyclic permutation matrices in the first order.

The above implementations mainly relate to reading a posterior probability message in a posterior probability message and a message transmitted to the variable node by the check node in a node message storage module, and obtaining, by calculation using the third calculation unit, the message transmitted to the check node by the variable node.

In some implementations, sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order, may include, e.g., sequentially arranging, using a permutation unit, the sequence of message transmitted to the check node by the variable node corresponding to each of the cyclic permutation matrices output by the third calculation unit, according to the order of the corresponding check node permuted from the order of the variable node.

The above implementation mainly utilizes the permutation unit to cyclic shift the message transmitted to the check node by the variable node so as to be transmitted into the first calculation unit for corresponding calculation.

In some implementations, the sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order may include, e.g., storing, using a first storage unit, symbol values of the message transmitted to the check node by the variable node corresponding to a plurality of the cyclic permutation matrices. The first storage unit may be provided with a first read address and a first write address, the first storage unit sequentially inputs the symbol values of the message transmitted to the check node by the variable node respectively corresponding to each of the cyclic permutation matrices in the first order through the first write address. The first storage unit may sequentially output the symbol values of the message transmitted to the check node by the variable node respectively corresponding to each of the cyclic permutation matrices in the second order through the first read address.

In some implementations, the sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order may include, e.g., storing, using a second storage unit, the latest negative message transmitted to the variable node by the check node corresponding to the plurality of cyclic permutation matrices stored in the node message storage module. The second storage unit may be provided with a second read address and a second write address. The second storage unit may sequentially input the latest negative message transmitted to the variable node by the check node respectively corresponding to each of the cyclic permutation matrices stored in the node message storage module in the first order through the second write address. The second storage unit may sequentially output latest negative message transmitted to the variable node by the check node respectively corresponding to each of the cyclic permutation matrices stored in the node message storage module in the second order through the second read address.

In some implementations, sequentially outputting the updated message transmitted to the variable node by the check node respectively corresponding to each of the cyclic permutation matrices in the second order may include, e.g., calculating, using a first calculation unit, a minimum value, a sub-minimum value and a symbol XOR value corresponding to a layer of the check matrix. In some implementations, sequentially outputting the updated message transmitted to the variable node by the check node respectively corresponding to each of the cyclic permutation matrices in the second order may include, e.g., sequentially receiving, using a message updating unit transmitted to the variable node by the check node, the symbol value of the message transmitted to the check node by the variable node respectively corresponding to each of the cyclic permutation matrices stored in the first storage unit in the second order, receiving the minimum value. The sub-minimum value and the symbol XOR value may correspond to a layer of the check matrix calculated by the first calculation unit. In some implementations, sequentially outputting the updated message transmitted to the variable node by the check node respectively corresponding to each of the cyclic permutation matrices in the second order may include, e.g., sequentially outputting, using the message updating unit transmitted to the variable node by the check node, the updated message transmitted to the variable node by the check node respectively corresponding to each of the cyclic permutation matrices in the second order.

The above implementations mainly relate to calculating the message transmitted to the check node by the variable node cyclic shifted in the permutation unit to get the updated message transmitted to the variable node by the check node.

In some implementations, sequentially outputting the updated message transmitted to the variable node by the check node respectively corresponding to each of the cyclic permutation matrices in the second order, and sequentially outputting the updated posterior probability message respectively corresponding to each of the cyclic permutation matrices in the second order may include, e.g., arranging, using an inverse permutation unit, a sequence of updated message transmitted to the variable node by the check node respectively corresponding to each of the cyclic permutation matrices, which are output in the second order by the message updating unit transmitted to the variable node by the check node, according to the order of the corresponding variable node permuted from the order of the check node.

The above implementations mainly relate to cyclic shifting the updated message transmitted to the variable node by updated check node using the inverse permutation unit so as to subsequently participate in the calculation in the second calculation unit.

In some implementations, sequentially outputting the updated posterior probability message respectively corresponding to each of the cyclic permutation matrices in the second order may include, e.g., sequentially outputting, using a second calculation unit, updated posterior probability message respectively corresponding to each of the cyclic permutation matrices in the second order based on the message corresponding to each of the cyclic permutation matrices obtained from the permutation by the inverse permutation unit, the message corresponding to each of the cyclic permutation matrices stored in the second storage unit, and the message corresponding to each of the cyclic permutation matrices stored in the posterior probability storage module.

The above implementations mainly relate to adding, by using the second calculation unit, the negative message transmitted to the variable node by the check node output from the second storage unit to the updated and shifted message transmitted to the variable node by the check node output from the inverse permutation unit, to get the updated posterior probability message.

In some implementations, the method may include receiving updated posterior probability message respectively corresponding to each of the cyclic permutation matrices, and substituting the received updated posterior probability message respectively corresponding to each of the cyclic permutation matrices into check equations to make a check. In some implementations, the method may include, if all the check equations are satisfied, determining that the coding is successful. In some implementations, the method may include if not all the check equations are satisfied, determining that the coding fails, and a next iteration is needed to update the posterior probability message and the message transmitted to the variable node by the check node until the coding is successful or the maximum iteration is reached.

The above implementations mainly relate to determining whether the iteration number is reached.

Figure 11:
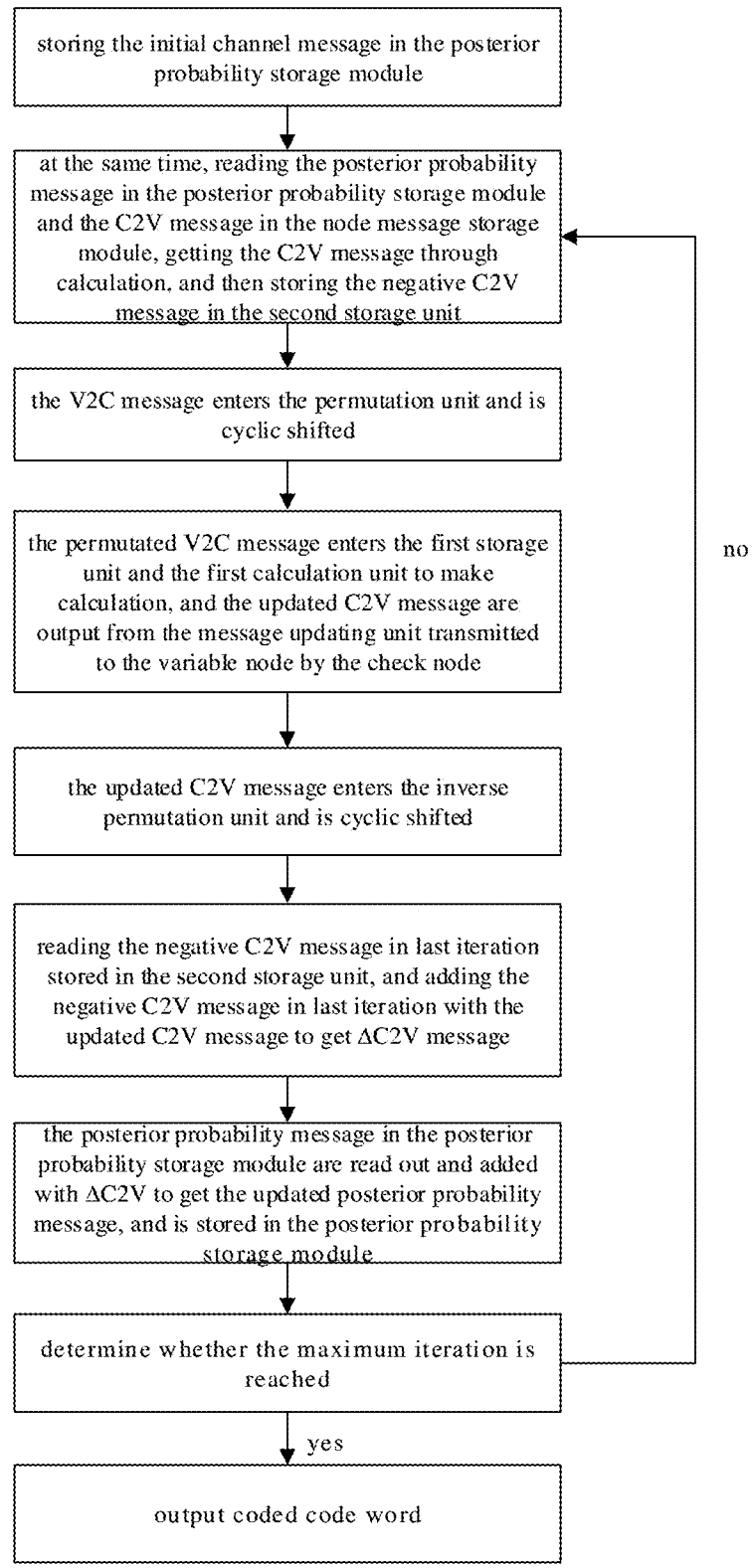
FIG. 11 is a frame flow diagram of a decoding method, according to an implementation of the present disclosure.

FIG. 11 is a coding flow chart provided by the implementation of the present disclosure. The coding method provided by the above implementations will be further described with reference to FIG. 7 and FIG. 11.

The coding begins after the initial channel message of a frame of code words are stored, reading the posterior probability message in the posterior probability storage module, as shown in $LLR^{read^1}$ in FIG. 7, reading the posterior probability message of one cyclic permutation matrix at a time. The C2V message read out from the node message storage module are inversed and added with $LLR^{read^1}$ to get the C2V message, and then enter the permutation unit, and the inversed V2C message are stored in the second storage unit.

The V2C message passes through the permutation unit and being cyclic shifted. One part of the permutated V2C message takes symbol values and stored in the first storage unit, the other part enters the first calculation unit to make calculation. The first calculation unit outputs the minimum value, column location, the sub-minimum value and the symbol XOR value corresponding to the V2C message of a layer of the check matrix, buffered into the third storage unit. The message updating unit transmitted to the variable node by the check node reads the data in the third storage unit and the V2C message symbol value buffered in the first storage unit to update the C2V message.

The updated C2V message passes through the inverse permutation unit and is cyclic shifted, and then stored in the node message storage module. At the same time, the second storage unit reads the negative C2V message stored in the node message storage module. The second calculation unit adds the negative C2V message and the updated C2V message to get $\Delta C2V$.

The posterior probability message stored in the posterior probability storage module are read out, as shown by $LLR^{read^2}$ in FIG. 7. The $LLR^{read^2}$ are added with $\Delta C2V$ by the second calculation unit to get the updated posterior probability message $LLR^{updated}$, which is stored in the posterior probability storage module to participate in subsequent message updating.

The above process is the updating process of the message in one iteration. After the completion of one iteration, it is determined whether the maximum iteration is reached. If the maximum iteration is not reached, the next iteration is performed, otherwise the decoding ends and the coded code word is output.

It should be understood that references to "one implementation" or "an implementation" throughout the specification mean that particular features, structures or characteristics related to the implementations are included in at least one implementation of the present disclosure. Thus, the phrases "in one implementation" or "in an implementation" appearing throughout the specification do not necessarily refer to the same implementation. In addition, these particular features, structures or characteristics may be combined arbitrarily in one or more implementations. It should be understood that in various implementations of the present disclosure, the sequence numbers of the above-mentioned processes do not mean that the sequence of execution, and the sequence of execution of various methods should be determined by their functions and inherent logic and should not constitute any limitation on the implementation of the examples of the present disclosure. The above serial number of implementations of that present disclosure are for description only and do not represent the advantages and disadvantages of the implementation.

The method disclosed in several implementations provided in the present disclosure may be arbitrarily combined without conflict to get new method implementations.

The foregoing are only implementations of the present disclosure, but the scope of protection of the present disclosure is not limited thereto. Any variation or permutation readily contemplated by those skilled in the art within the scope of the present disclosure should be covered within the scope of protection of the present disclosure. Therefore, the scope of protection of this disclosure shall be subject to the scope of protection of the claims.

What is claimed is:

1. A decoder, comprising:
   a posterior probability storage module configured to:
   store a posterior probability message respectively corresponding to each of a plurality of cyclic permutation matrices;
   a node message storage module configured to:
   store a message transmitted to a variable node by a check node respectively corresponding to each of the plurality of cyclic permutation matrices; and
   a message updating module configured to:
   sequentially receive the posterior probability message and the message transmitted to the variable node by the check node respectively corresponding to each of the plurality of cyclic permutation matrices in a first order; and sequentially output an updated message transmitted to the variable node by the check node and an updated posterior probability message respectively corresponding to each of the plurality of cyclic permutation matrices in a second order, wherein the first order is different from the second order, and wherein the message updating module further comprises:

an inverse permutation unit configured to:

arrange a sequence of the updated message transmitted to the variable node by the check node respectively corresponding to each of the plurality of cyclic permutation matrices, which are output in the second order by the message updating unit transmitted to the variable node by the check node, according to an order of a corresponding variable node permuted from the order of the check node.

2. The decoder of claim 1, wherein the message updating module comprises:

a first storage unit configured to:

store symbol values of the message transmitted to the check node by the variable node corresponding to a plurality of the plurality of cyclic permutation matrices, the first storage unit being provided with a first read address and a first write address, the first storage unit being caused to sequentially input the symbol values of the message transmitted to the check node by the variable node respectively corresponding to each of the plurality of cyclic permutation matrices in the first order through the first write address, and the first storage unit being caused to sequentially output the symbol values of the message transmitted to the check node by the variable node respectively corresponding to each of the plurality of cyclic permutation matrices in the second order through the first read address; and a second storage unit configured to:

store a latest negative message transmitted to the variable node by the check node corresponding to the plurality of cyclic permutation matrices stored in the node message storage module, the second storage unit being provided with a second read address and a second write address, the second storage unit being caused to sequentially input the latest negative message transmitted to the variable node by the check node respectively corresponding to each of the plurality of cyclic permutation matrices stored in the node message storage module in the first order through the second write address, and the second storage unit being caused to sequentially output latest negative message transmitted to the variable node by the check node respectively corresponding to each of the plurality of cyclic permutation matrices stored in the node message storage module in the second order through the second read address.

3. The decoder of claim 2, wherein the first storage unit and the second storage unit respectively comprise a random access memory.

4. The decoder of claim 2, wherein:

a depth of the first storage unit is a total weight of a quasi-cyclic low-density parity check code base matrix, a width of the first storage unit is a product of a size of a cyclic permutation matrix and the width of the message of a check node transmitted to the variable node by the check node, a depth of the second storage unit is the total weight of the quasi-cyclic low-density parity check code base matrix, and a width of the second storage unit is the size of a cyclic permutation matrix.

5. The decoder of claim 2, wherein the message updating module further comprises:

a first calculation unit configured to:

calculate a first value, a second value, and a symbol XOR value corresponding to a layer of a check matrix; and a message updating unit transmitted to the variable node by the check node and configured to:

sequentially receive the symbol values of the message transmitted to the check node by the variable node respectively corresponding to each of the plurality of cyclic permutation matrices stored in the first storage unit in the second order;

receive the first value, the second value and the symbol XOR value corresponding to a layer of the check matrix calculated by the first calculation unit; and sequentially output the updated message transmitted to the variable node by the check node respectively corresponding to each of the plurality of cyclic permutation matrices in the second order.

6. The decoder of claim 5, wherein the message updating module further comprises:

a second calculation unit configured to:

sequentially output the updated posterior probability message respectively corresponding to each of the plurality of cyclic permutation matrices in the second order based on the message corresponding to each of the plurality of cyclic permutation matrices obtained from a permutation by the inverse permutation unit, the message corresponding to each of the plurality of cyclic permutation matrices stored in the second storage unit, and the message corresponding to each of the plurality of cyclic permutation matrices stored in the posterior probability storage module.

7. The decoder of claim 2, wherein the message updating module further comprises:

a third calculation unit configured to:

sequentially receive a latest posterior probability message respectively corresponding to each of the plurality of cyclic permutation matrices stored in the posterior probability storage module in the first order;

sequentially receive the latest negative message transmitted to the variable node by the check node respectively corresponding to each of the plurality of cyclic permutation matrices stored in the node message storage module in the first order; and sequentially output the message transmitted to the check node by the variable node respectively corresponding to each of the plurality of cyclic permutation matrices in the first order.

8. The decoder of claim 7, wherein the message updating module further comprises:

a permutation unit configured to:

sequentially arrange a sequence of message transmitted to the check node by the variable node corresponding to each of the plurality of cyclic permutation matrices output by the third calculation unit, according to an order of the corresponding check node permuted from the order of the variable node.

9. The decoder of claim 1, wherein the posterior probability storage module comprises two real dual-port random access memories.

10. The decoder of claim 1, wherein the posterior probability message is a log-likelihood ratio (LLR) message.

11. A memory system, comprising:
a memory controller, comprising:
a decoder, comprising:
a posterior probability storage module configured to:
store a posterior probability message respectively corresponding to each of a plurality of cyclic permutation matrices;
a node message storage module configured to:
store a message transmitted to a variable node by a check node respectively corresponding to each of the plurality of cyclic permutation matrices; and
a message updating module configured to:
sequentially receive the posterior probability message and the message transmitted to the variable node by the check node respectively corresponding to each of the plurality of cyclic permutation matrices in a first order; and
sequentially output an updated message transmitted to the variable node by the check node and an updated posterior probability message respectively corresponding to each of the plurality of cyclic permutation matrices in a second order,
wherein the first order is different from the second order, and
wherein the message updating module further comprises:
an inverse permutation unit configured to:
arrange a sequence of the updated message transmitted to the variable node by the check node respectively corresponding to each of the plurality of cyclic permutation matrices, which are output in the second order by the message updating unit transmitted to the variable node by the check node, according to an order of a corresponding variable node permuted from the order of the check node; and
a memory device coupled to the memory controller.

12. The memory system of claim 11, wherein the message updating module comprises:
a first storage unit configured to:
store symbol values of the message transmitted to the check node by the variable node corresponding to a plurality of the plurality of cyclic permutation matrices, the first storage unit being provided with a first read address and a first write address, the first storage unit being caused to sequentially input the symbol values of the message transmitted to the check node by the variable node respectively corresponding to each of the plurality of cyclic permutation matrices in the first order through the first write address, and the first storage unit being caused to sequentially output the symbol values of the message transmitted to the check node by the variable node respectively corresponding to each of the plurality of cyclic permutation matrices in the second order through the first read address; and
a second storage unit configured to:
store a latest negative message transmitted to the variable node by the check node corresponding to the plurality of cyclic permutation matrices stored in the node message storage module, the second storage unit being provided with a second read address and a second write address, the second storage unit being caused to sequentially input the latest negative message transmitted to the variable node by the check node respectively corresponding to each of the plurality of cyclic permutation matrices stored in the node message storage module in the first order through the second write address, and the second storage unit being caused to sequentially output latest negative message transmitted to the variable node by the check node respectively corresponding to each of the plurality of cyclic permutation matrices stored in the node message storage module in the second order through the second read address.

13. A method of decoding, comprising:
storing a posterior probability message respectively corresponding to each of a plurality of cyclic permutation matrices using a posterior probability storage module;
storing the message transmitted to a variable node by a check node respectively corresponding to each of the plurality of cyclic permutation matrices using a node message storage module;
sequentially receiving, using a message updating module, the posterior probability message and the message transmitted to the variable node by the check node respectively corresponding to each of the plurality of cyclic permutation matrices in a first order; and
sequentially outputting, using a message updating module, an updated message transmitted to the variable node by the check node and an updated posterior probability message respectively corresponding to each of the plurality of cyclic permutation matrices in a second order,
wherein the first order is different from the second order, and
wherein the sequentially outputting, using the message updating module, updated message transmitted to the variable node by the check node and the updated posterior probability message respectively corresponding to each of the plurality of cyclic permutation matrices in the second order comprises:
arranging, using an inverse permutation unit, a sequence of updated message transmitted to the variable node by the check node respectively corresponding to each of the plurality of cyclic permutation matrices, which are output in the second order by the message updating unit transmitted to the variable node by the check node, according to an order of a corresponding variable node permuted from the order of the check node.

14. The method of claim 13, wherein the sequentially outputting, using the message updating module, the updated message transmitted to the variable node by the check node and the updated posterior probability message respectively corresponding to each of the plurality of cyclic permutation matrices in the second order comprises:
storing, using a first storage unit, symbol values of the message transmitted to the check node by the variable node corresponding to a plurality of the plurality of cyclic permutation matrices, the first storage unit being provided with a first read address and a first write address, the first storage unit being caused to sequentially input the symbol values of the message transmitted to the check node by the variable node respectively corresponding to each of the plurality of cyclic permutation matrices in the first order through the first write address, and the first storage unit being caused to sequentially output the symbol values of the message transmitted to the check node by the variable node respectively corresponding to each of the plurality of cyclic permutation matrices in the second order through the first read address; and storing, using a second storage unit, the latest negative message transmitted to the variable node by the check node corresponding to the plurality of cyclic permutation matrices stored in the node message storage module, the second storage unit being provided with a second read address and a second write address, the second storage unit being caused to sequentially input the latest negative message transmitted to the variable node by the check node respectively corresponding to each of the plurality of cyclic permutation matrices stored in the node message storage module in the first order through the second write address, and the second storage unit being caused to sequentially output latest negative message transmitted to the variable node by the check node respectively corresponding to each of the plurality of cyclic permutation matrices stored in the node message storage module in the second order through the second read address.

15. The method of claim 14, wherein the sequentially outputting, using the message updating module, the updated message transmitted to the variable node by the check node respectively corresponding to each of the plurality of cyclic permutation matrices in the second order comprises:

calculating, using a first calculation unit, a first value, a second value and a symbol XOR value corresponding to a layer of a check matrix;

sequentially receiving, using a message updating unit transmitted to the variable node by the check node, the symbol values of the message transmitted to the check node by the variable node respectively corresponding to each of the plurality of cyclic permutation matrices stored in the first storage unit in the second order;

receiving, using the message updating unit transmitted to the variable node by the check node, the first value, the second value and the symbol XOR value corresponding to a layer of the check matrix calculated by the first calculation unit; and sequentially outputting, using the message updating unit transmitted to the variable node by the check node, the updated message transmitted to the variable node by the check node respectively corresponding to each of the plurality of cyclic permutation matrices in the second order.

16. The method of claim 15, wherein the sequentially outputting, using the message updating module, the updated posterior probability message respectively corresponding to each of the plurality of cyclic permutation matrices in the second order comprises:

sequentially outputting, using a second calculation unit, the updated posterior probability message respectively corresponding to each of the plurality of cyclic permutation matrices in the second order based on the message corresponding to each of the plurality of cyclic permutation matrices obtained from a permutation by the inverse permutation unit, the message corresponding to each of the plurality of cyclic permutation matrices stored in the second storage unit, and the message corresponding to each of the plurality of cyclic permutation matrices stored in the posterior probability storage module.

17. The method of claim 14, wherein the sequentially outputting, using the message updating module, the updated message transmitted to the variable node by the check node and the updated posterior probability message respectively corresponding to each of the plurality of cyclic permutation matrices in the second order comprises:

sequentially receiving, using a third calculation unit, a latest posterior probability message respectively corresponding to each of the plurality of cyclic permutation matrices stored in the posterior probability storage module in the first order;

sequentially receiving, using the third calculation unit, a latest negative message transmitted to the variable node by the check node respectively corresponding to each of the plurality of cyclic permutation matrices stored in the node message storage module in the first order; and sequentially outputting, using the third calculation unit, the message transmitted to the check node by the variable node respectively corresponding to each of the plurality of cyclic permutation matrices in the first order.

18. The method of claim 17, wherein the sequentially outputting, using the message updating module, the updated message transmitted to the variable node by the check node and the updated posterior probability message respectively corresponding to each of the plurality of cyclic permutation matrices in the second order comprises:

sequentially arranging, using a permutation unit, a sequence of message transmitted to the check node by the variable node corresponding to each of the plurality of cyclic permutation matrices output by the third calculation unit, according to an order of the corresponding check node permuted from the order of the variable node.

19. The method claim 13, further comprising:

receiving the updated posterior probability message respectively corresponding to each of the plurality of cyclic permutation matrices;

after the updated posterior probability message is received, substituting the updated posterior probability message respectively corresponding to each of the plurality of cyclic permutation matrices into check equations to make a check;

if all the check equations are satisfied, determining that the decoding is successful; and if not all the check equations are satisfied, determining that the decoding fails, and a next iteration is needed to update the posterior probability message and the message transmitted to the variable node by the check node until the decoding is successful or a maximum iteration is reached.

20. The method of claim 13, wherein the posterior probability message is a log-likelihood ratio (LLR) message.

* * * * *